US012706384B2

(12) United States Patent
Praino et al.

(10) Patent No.: US 12,706,384 B2
(45) Date of Patent: Aug. 11, 2026

(54) TRANSPARENT RADIO FREQUENCY ANTENNA AND EMI SHIELD

(71) Applicant: Chasm Advanced Materials, Inc., Canton, MA (US)

(72) Inventors: Robert F. Praino, Westwood, MA (US); David J. Arthur, Braintree, MA (US); Emiliano Mezzarobba, Canton, MA (US); Daniel Skiba, Canton, MA (US)

(73) Assignee: Chasm Advanced Materials, Inc., Canton, MA (US)

( * ) Notice: Subject to any disclaimer, the term of this patent is extended or adjusted under 35 U.S.C. 154(b) by 21 days.

(21) Appl. No.: 19/007,104

(22) Filed: Dec. 31, 2024

(65) Prior Publication Data

US 2025/0141108 A1 May 1, 2025

Related U.S. Application Data

(62) Division of application No. 17/973,081, filed on Oct. 25, 2022, now Pat. No. 12,230,898.

(60) Provisional application No. 63/271,265, filed on Oct. 25, 2021.

(51) Int. Cl.

| | |
|---|---|
| ***H05K 9/00*** | (2006.01) |
| ***H01Q 1/36*** | (2006.01) |
| ***H01Q 1/52*** | (2006.01) |
| ***H01Q 9/04*** | (2006.01) |

(52) U.S. Cl.
CPC ........... *H01Q 9/0407* (2013.01); *H01Q 1/368* (2013.01); *H01Q 1/526* (2013.01); *H05K 9/009* (2013.01)

(58) Field of Classification Search
CPC ............................... H01Q 1/368; H05K 9/009
See application file for complete search history.

(56) References Cited

U.S. PATENT DOCUMENTS

2018/0226713 A1* 8/2018 Lerner ..................... H01Q 1/38
2019/0059151 A1* 2/2019 Burns, IV ............ H05K 1/0281

* cited by examiner

*Primary Examiner* — Daniel Munoz
(74) *Attorney, Agent, or Firm* — Brian M. Dingman; Prince Lobel Tye, LLP

(57) ABSTRACT

This disclosure includes, and results in the creation of, a printed carbon nanotube and/or graphene hybrid antenna and/or EMI shield, comprised of a conductive layer that comprises a metal mesh (MM) layer or a nanowire layer on a substrate, with a printed Signal Enhancement Layer (SEL) on the conductive layer. The SEL includes an ink that includes one or both of carbon nanotube (CNT) and graphene. The circuit pattern results after the “exposed” conductive layer (i.e., the regions where the CNT/graphene ink is not printed) is removed via chemical etching or mechanical cutting. The structure (the antenna/EMI shield) is preferably but not necessarily transparent.

14 Claims, 25 Drawing Sheets

Gain (dB)
10
8
6
4
3
2
0
-2
-3
-4
-6
-8
-10
Simulated G3
Measured Ant
5G BAND n77
2800
3200
3600
4000
Freq (MHz)

TRANSPARENT RADIO FREQUENCY ANTENNA AND EMI SHIELD

CROSS-REFERENCE TO RELATED APPLICATIONS

This application claims priority of U.S. patent application Ser. No. 17/973,081 filed on Oct. 25, 2022, which itself claimed priority of Provisional Patent Application 63/271,265 filed on Oct. 25, 2021. The entire disclosures of these prior Applications are incorporated herein by reference in their entireties and for all purposes.

BACKGROUND

This disclosure relates to a radio frequency antenna and an electromagnetic interference (EMI) shield.

International Patent Application Publication No. WO 2016/172315 A1 describes a printed carbon nanotube (CNT) hybrid transparent conductive film comprising a silver nanowire (AgNW) layer and a printed CNT ink layer. The entire disclosure of the publication is incorporated herein by reference in its entirety and for all purposes. This publication also describes a "wet wiping" method for removing the exposed AgNW regions (i.e., the regions where the CNT ink is not printed).

International Patent Application Publication No. WO 2020/102392 describes a printed CNT hybrid transparent conductive film comprising a metal mesh (MM) layer and a printed CNT ink layer used as a simple transparent conductive film. The entire disclosure of the publication is incorporated herein by reference in its entirety and for all purposes. A chemical etchant is used to dissolve the exposed regions where the CNTs are not printed to create the conductive pattern.

SUMMARY

This disclosure is in part distinguished from the prior art as follows: 1) the synergy of combining CNTs and/or graphene plus copper (Cu) mesh on RF properties of transparent circuit structures; 2) the RF shielding and transmission/reception benefits of applying the CNT and/or graphene ink on top of the mesh; 3) the RF shielding and transmission benefits of controlling the Cu mesh dimensions; 4) a printed carbon nanotube and/or graphene hybrid transparent antenna; 5) a printed carbon nanotube and/or graphene hybrid transparent EMI shield structure.

A benefit of using MM is that very low (0.2 to 1 ohm/sq) sheet resistance values can be realized for the transparent CNT and/or graphene hybrid film structure, while maintaining high transparency (85%-90% visible light transmission (VLT)). Low sheet resistance (Rs) is a useful property for antennas and for EMI shielding.

A benefit of using chemical etchant to dissolve the exposed MM regions is that it is not practical to use simple water/organic solvent wet wiping to remove the MM. However, for chemical etching to work, the printed CNT and/or graphene ink has to also act as an etch mask. This makes the ink a multifunctional material. Not only does the ink allow for the creation of a CNT and/or graphene hybrid (either CNT and/or graphene+MM with polymer binder used in the ink formulation) transparent conductive film that is better than CNT or MM alone. The ink also enables standard flexible printed circuit processing methodology to be used (i.e., use a chemical etchant to dissolve the conductive regions not covered by the etch mask). Etching conditions are described in International Publication No. WO 2020/102392.

An alternative to etching is to use a "kiss"-type automated cutter system to pattern films.

In another embodiment, the substrate may incorporate a silver nanowire layer (AgNW) to function as the conductive layer, substituted for the MM as described above. The nanowires can be made of other conductive materials (e.g., copper), as further described elsewhere herein.

In another embodiment, the CNT and/or graphene hybrid film structure can be used as a high-performance EMI shielding film.

DETAILED DESCRIPTION

Examples of the systems, methods and apparatuses discussed herein are not limited in application to the details of construction and the arrangement of components set forth in the following description or illustrated in the accompanying drawings. The systems, methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the computer program products, systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Impact of the Signal Enhancement Layer of RF Antenna Performance:

An aspect of the present disclosure is the significant impact on antenna response in the 5G frequency range (approximately 3.2-3.8 GHz). Shown below are the results from testing with (FIG. 1A) and without (FIG. 1B) a signal enhancement layer (SEL) printed over the top of the MM layer. Testing was carried out using both a microstrip evaluation (used to characterize the materials) and an antenna evaluation over a wide frequency range.

Figures 1A, 1B:
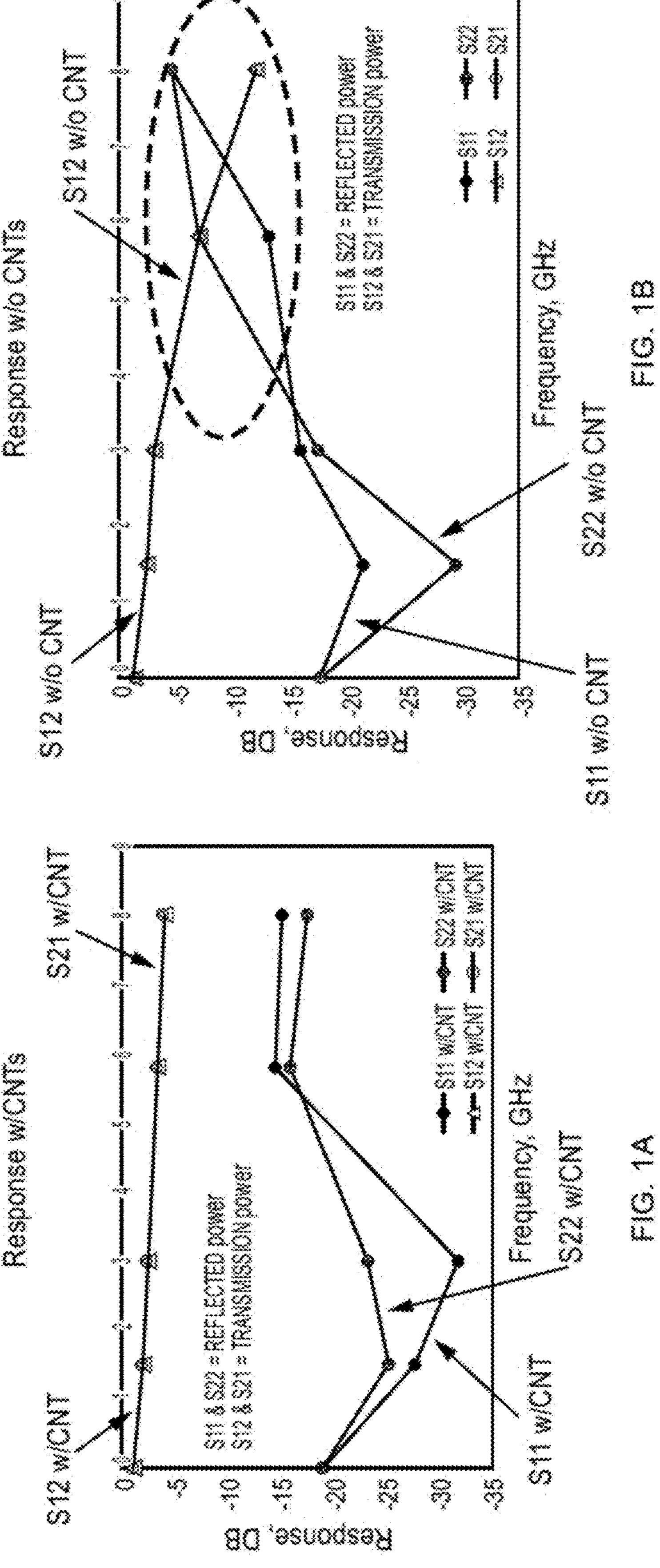
FIG. 1A illustrates the response (S11, S22, S12, and S21) from testing a microstrip with a SEL.
FIG. 1B illustrates the response without the SEL.
Figure 2A:
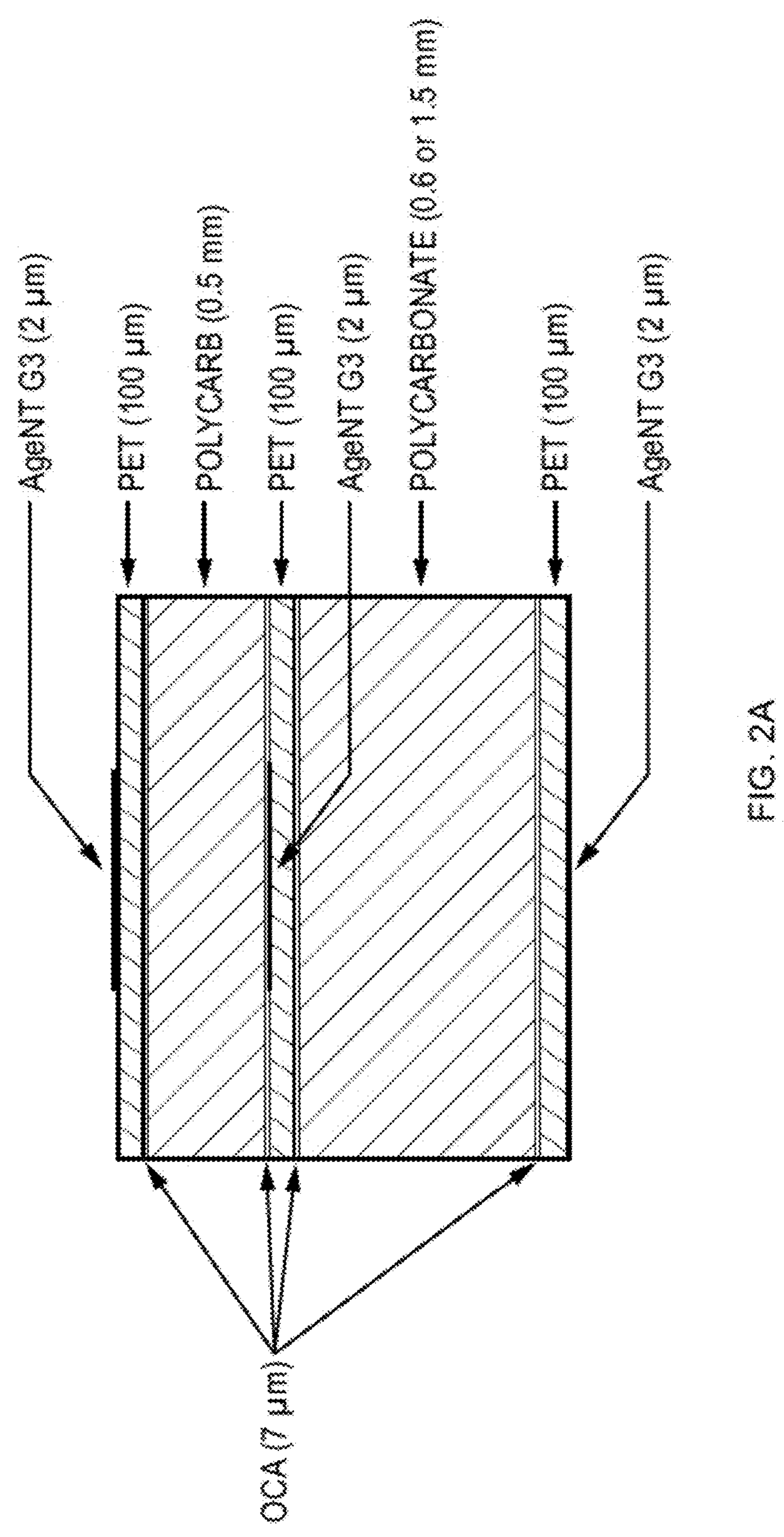
FIG. 2A illustrates a patch SEL antenna.
Figures 2B, 2C:
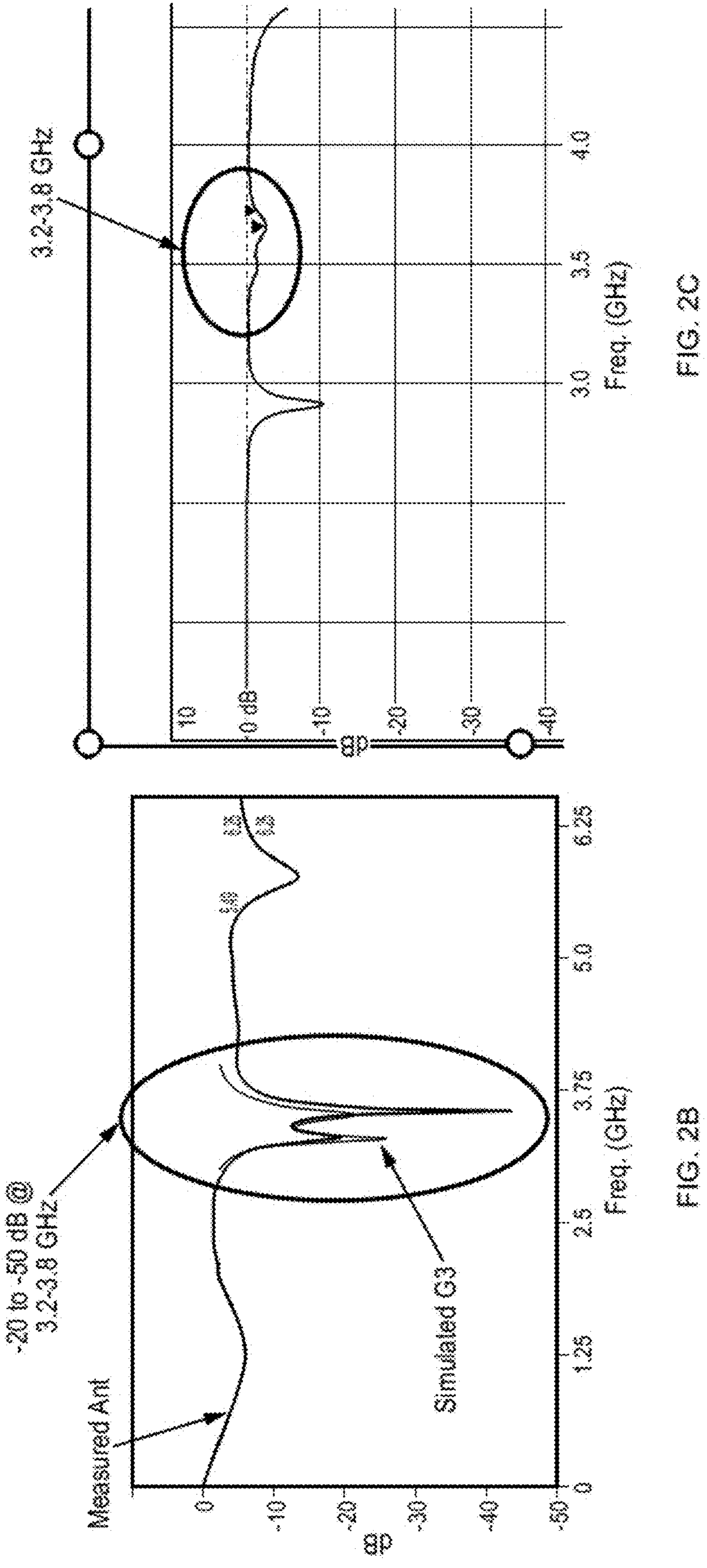
FIG. 2B illustrates the antenna response.
FIG. 2C illustrates the response without the SEL.

FIG. 1B displays the microstrip results and the S11 and S22 response parameters lacking a dB drop of return loss (reflectance), as indicated by the dashed oval region at higher frequencies where reflected power substantially increase, indicating poor antenna performance at high frequencies. A good target response is aimed at:

- If S11 & S22 low➔ energy transmitted or dissipated as thermal loss
- If S12 & S21 high➔ high transmission & reception of the signal Additional testing was carried out with a "patch" antenna, as illustrated in FIG. 2A. The antenna has five substrates as indicated, with AgeNT G3 SEL layers on top of substrate 1, at the interface of substrates 2 and 3, and at the bottom of substrate 5. An optically clear adhesive (OCA) is used to create the stack. FIG. 2B illustrates the response of this patch antenna with AgeNT-G3 (defined elsewhere herein) showing a substantial response in the 5G band. FIG. 2C illustrates the antenna response without the SEL, showing little response in the same band (the band in both figures indicated by the regions inside the ovals). AgeNT is defined in the patent publications that are incorporated herein by reference. AgeNT is, most basically, a MM or nanowire conductive layer on a substrate and overlain by a printed ink containing CNT and/or graphene and optionally a binder.

Embodiments

- Substrates PET (polyethylene terephthalate), COP (cycloolefin polymer), CPI (clear polyimide), PC (polycarbonate)
- Structure MM material Cu, Ag, Al, Sn, and potentially other metals that meet performance needs
  - MM pitch 50, 100, 200, 250, 300, 400, 500 microns
  - Line width 3, 5, 7, 10, 15, 20 microns
  - Line height 0.25, 0.5, 0.75, 1, 2, 3 microns
  - Line pattern Square, hexagonal, random, fractal
  - MM Structure layers:
    - Substrate/primer layer/blackening/metal mesh/signal enhancement layer/and optional topcoat (which is preferably not required)
  - AgNW material:
    - Diameter 15-35 nm
    - Length 20-50 microns
  - AgNW coverage of 15 mg/m2 to 150 mg/m2, preferably ~100 mg/m2
  - Nanowire Structure layers:
    - Substrate/primer layer/AgNW/signal enhancement layer/optional topcoat (preferably not required)
- Signal enhancement layer (SEL): carbon nanotubes (CNTs); CNT & graphene; graphene with or without binder, concentration of conductive components (CNTs and/or graphene) 0.05, 0.1, 0.2, 0.3, 0.4, 0.5 grams per liter for each component or as blends or combinations
- SEL conductive component surface coverage: 3 mg/m2, or 0.75, 1.5, 2.25, 3 mg/m2 & preferably 3 mg/m2, 5 mg/m2
- SEL composition w/binder: binder/conductive component ratio 1/1, 20/1, 100/1, 200/1, 240/1, 300/1, 400/1

Definition of Various MM Embodiments

- MM-G1 Line spacing (pitch) 500 microns in a hexagonal pattern, line width 30 microns, line height 0.5-1.5 microns
- MM-G2 Line pitch 300 microns in a square pattern, line width 5 microns, line height 2 microns
- MM-G3 Line pitch 100 microns in a square pattern, line width 5 microns, line height 2 microns Results and Examples of Performance Material Characterization: Microstrip Testing Because neither layer of the hybrid structure is a bulk material, the electromagnetic permittivity of the substrate is needed in order to model and simulate the antennas:

- Dielectric constant ($\varepsilon_r$), associated to the frequency of operation
- Dissipation factor (Tan D), describing the losses in the substrate mainly responsible for radiation efficiency loss Because the material doesn't have constant characteristics across frequency a full RF characterisation is required. A complex (real and imaginary part) permittivity can be measured using a dielectric probe sensor. A limited number of materials were initially characterized using the intended substrates for the antenna at the desired frequencies. The Keysight 85070E Dielectric Probe Kit, used with a Keysight network analyser, determines the intrinsic electromagnetic properties of many dielectric materials. These properties are determined by the molecular structure. The setup tests dielectric materials in the range of 200 MHz to 50 GHz and provides important information about materials used in state-of-the-art RF and microwave electronic components.

Figure 3A:
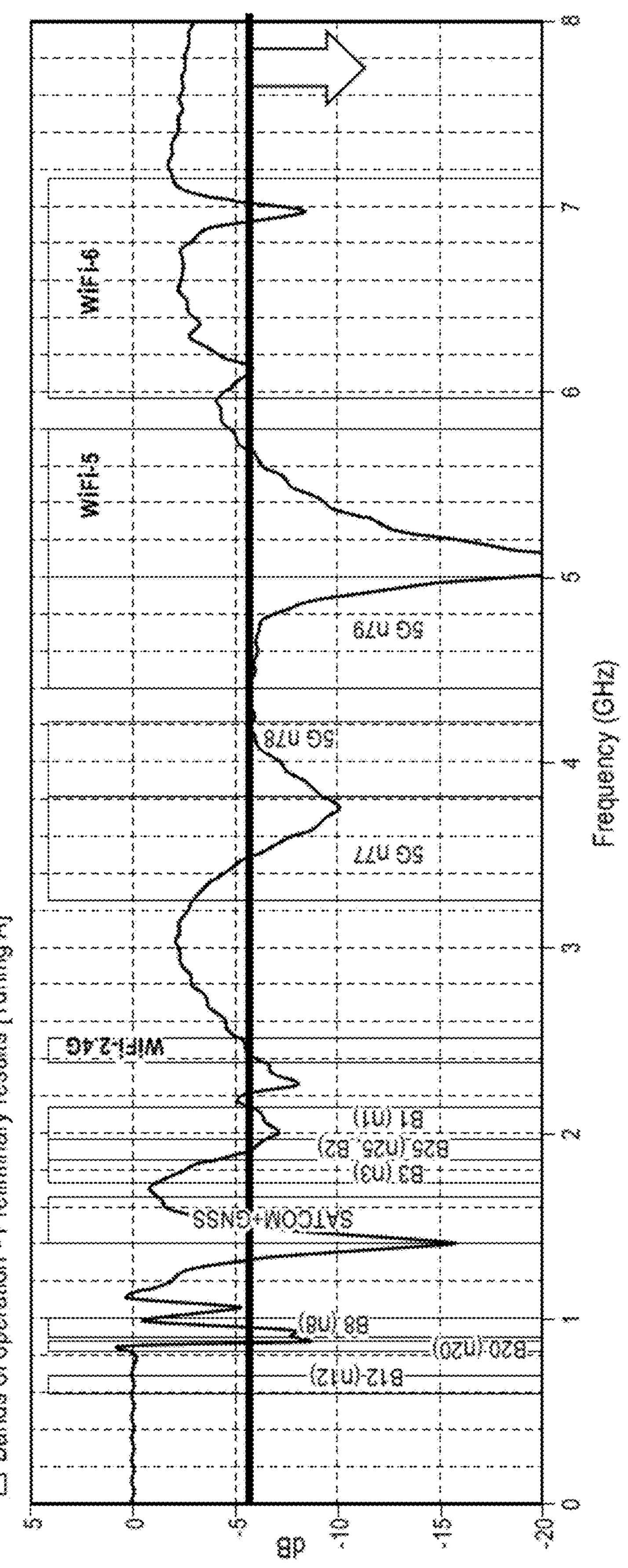
FIG. 3A is a simulation of a copper multi-band tunable antenna tuned to the low frequency band.
Figure 3B:
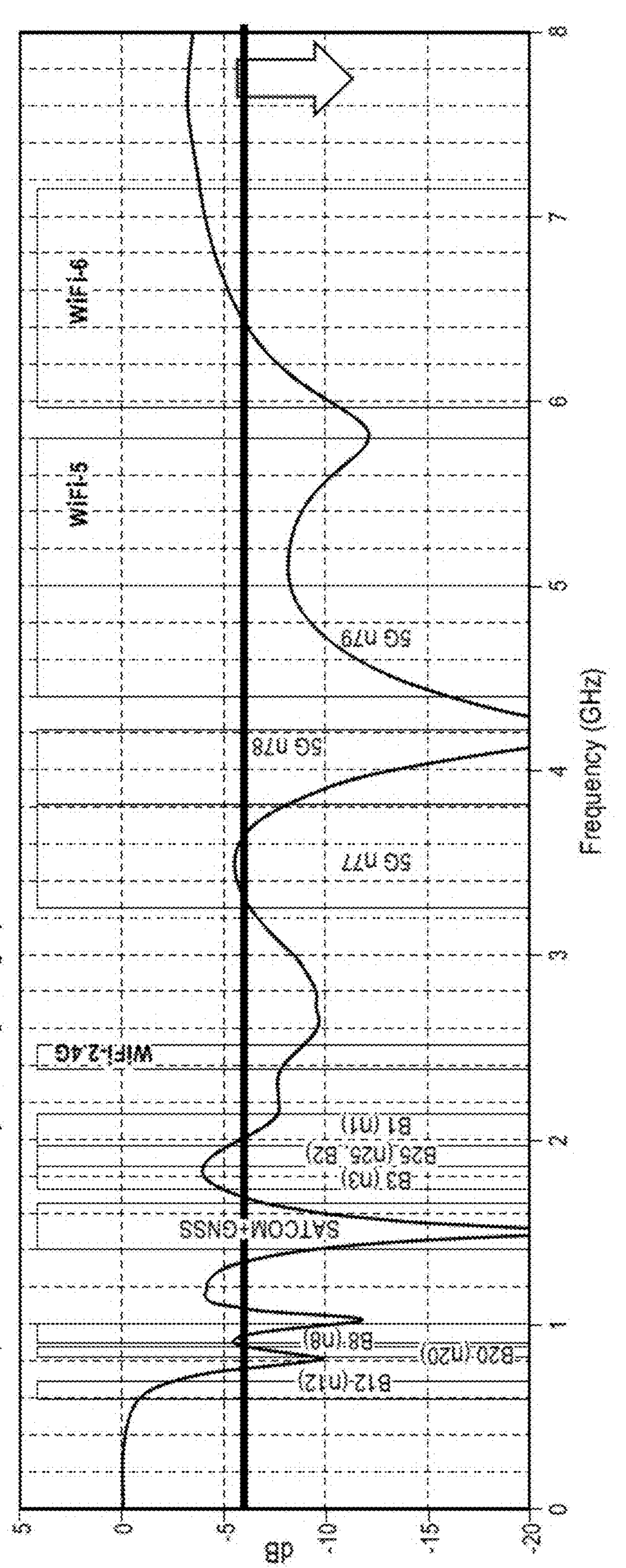
FIG. 3B is a simulation of the antenna with a SEL.
Figure 4A:
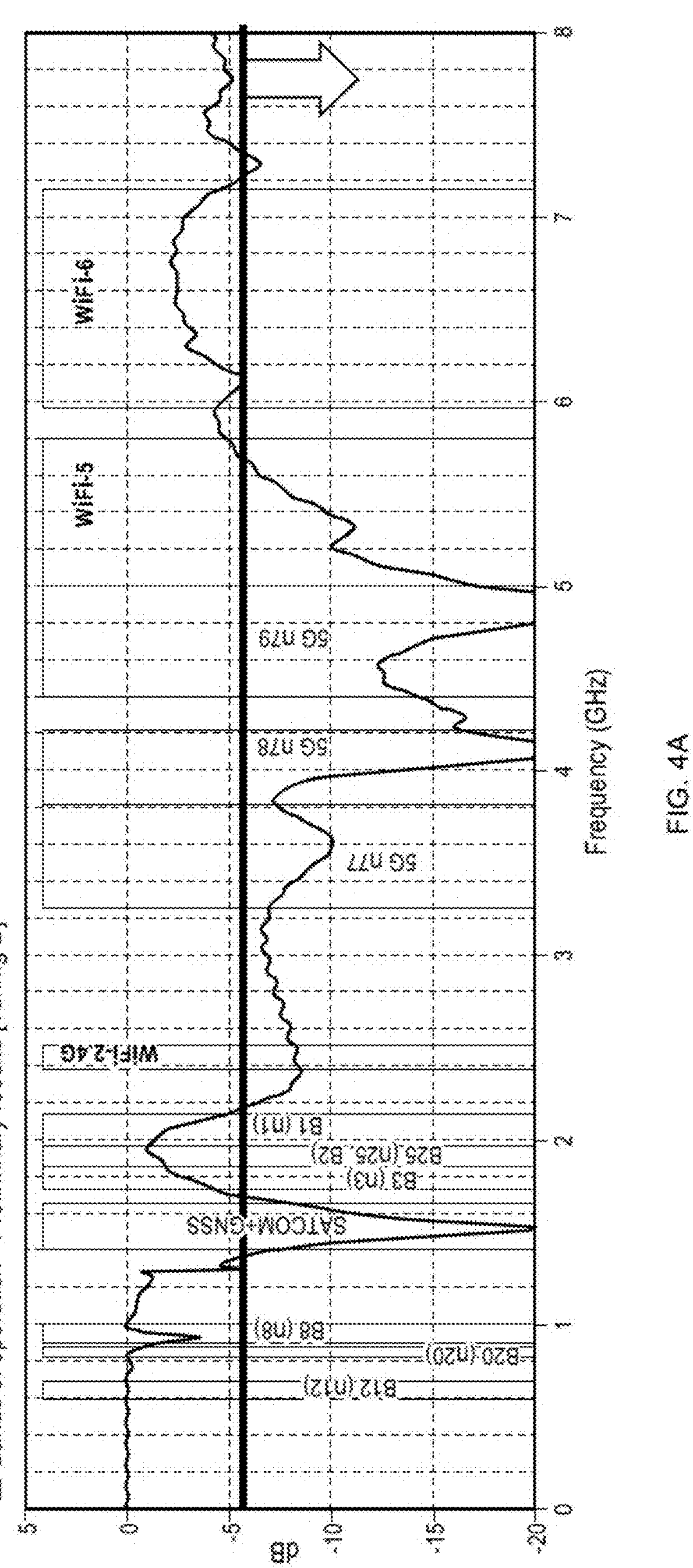
FIG. 4A is a simulation of a copper multi-band tunable antenna tuned to the middle high frequency band.
Figure 4B:
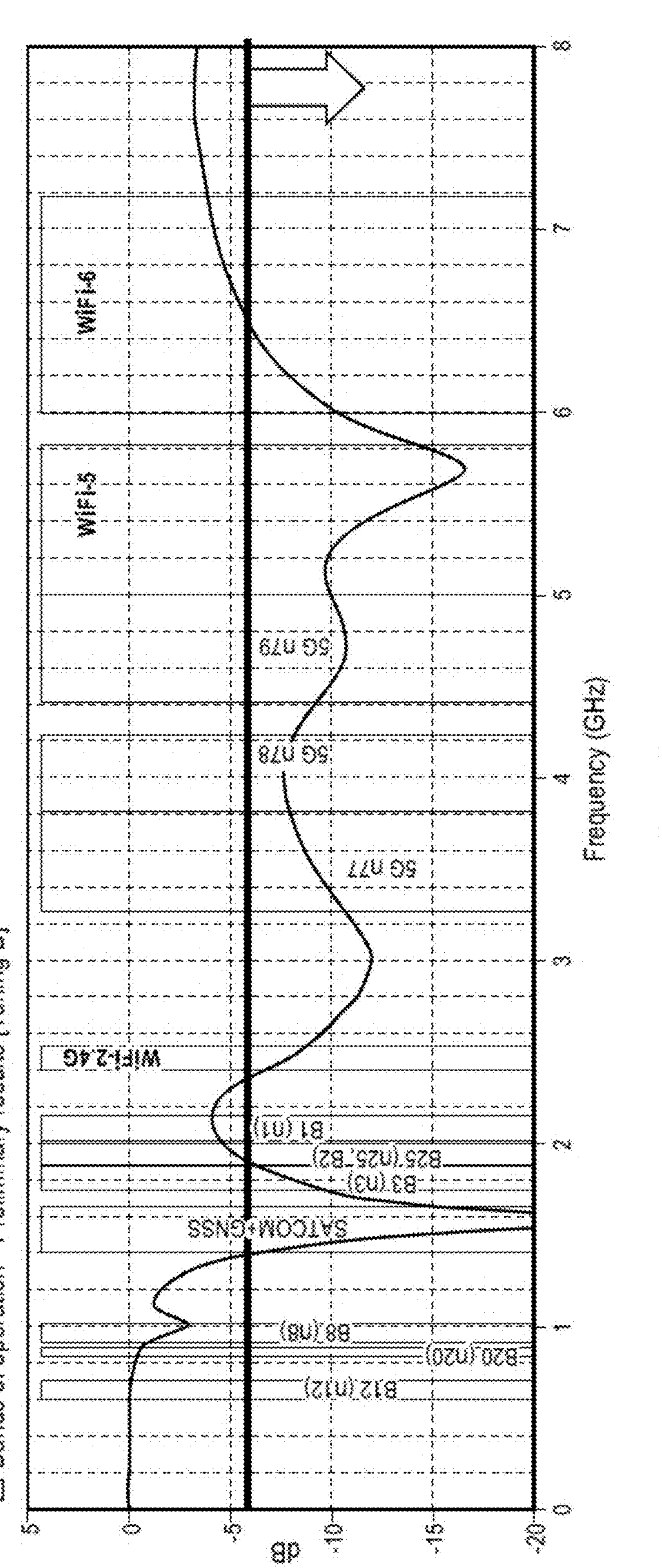
FIG. 4B is a simulation of the antenna with a SEL.
Figure 5A:
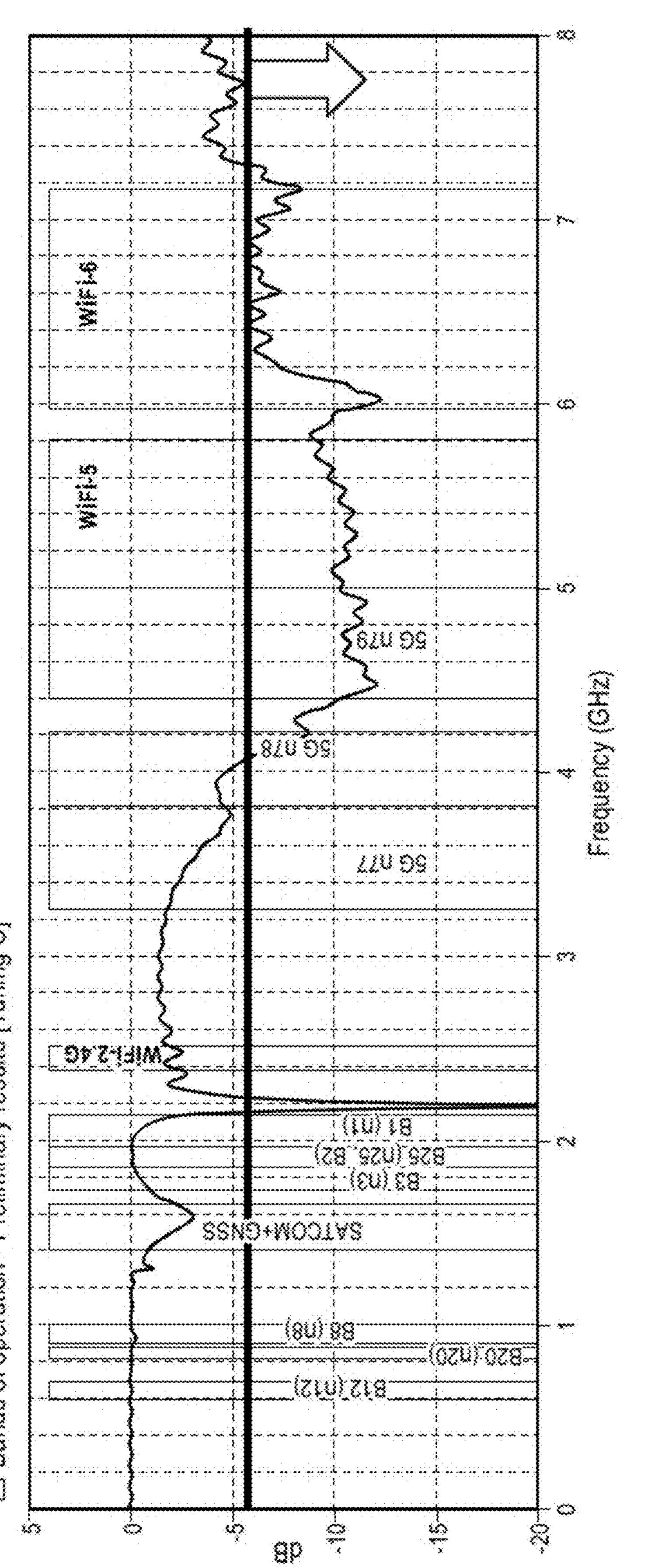
FIG. 5A is a simulation of a copper multi-band tunable antenna tuned to the high frequency band.
Figure 5B:
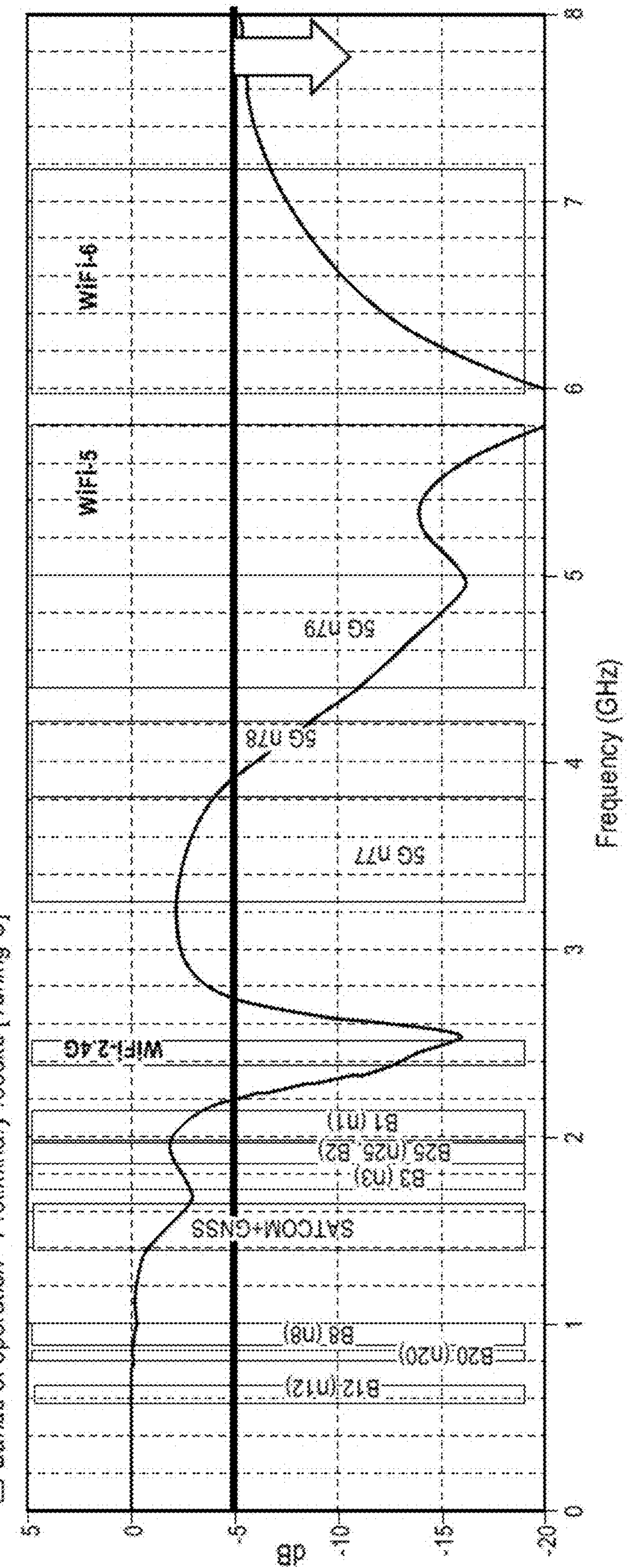
FIG. 5B is a simulation of the antenna with a SEL.

Preliminary Simulation—Feasibility Demonstration:

Using initial measured dielectric and dissipation factor parameters, simulation comparisons were done for various frequency ranges by adding tuning parameters for a multi-band tunable antenna to compare the Agent MM-G2 material set with a design based on copper. As is shown in FIG. 3A as compared to FIG. 3B, FIG. 4A as compared to FIG. 4B, and FIG. 5A as compared to Fig. and 5C, the MM-G2 demonstrated good response in three different ranges of frequencies (low band, middle high band, and high band, respectively), and was comparable to an antenna using solid copper for the conductive layers illustrated in FIGS. 3A, 4A, and 5A.

Microstrip Material Characterization:

Completion of the initial simulations enabled subsequent measurements using a prototype comprising a set of microstrip test circuits that allowed measurement of the conductivity of the material.

Using a network vector analyzer, the characteristic information for the designed micro-strip lines was determined and compared with the simulations. From S-parameters measurements at the specific frequencies skin effects and anomalies due to the sandwich stack were evaluated. The impedance measurement also allows determination of the conductivity values to use in the EM simulation models for these frequencies.

Comparison of the simulation results (microstrip test structures) with measurement results enables design of antennas with predictable performance.

The pitch of the metal mesh lines impacts the ability to simulate expected antenna performance. Using the results of the microstrip testing as the tool to characterize the materials as described above, response of the antenna can be defined at various frequencies based on the S11, S22, S12, and S21 parameters.

S parameters define the reflected wave at a particular port in terms as of the incident wave at each port.

A goal is to have S11 & S22 low ➔ energy is either transmitted (DESIRED) or dissipated as thermal loss. For example: S21=0 ➔ all power from Port1 gets to Port2: if S21=−10 DB ➔ only 10% gets to Port or ant2.

MM-G2 Microstrip Simulation Results:

For the MM-G2 geometry (300 um line pitch), simulation of the antenna did not result in solution closure for the calculations. Parameter optimization and impedance optimization had some physical limits and could not be adjusted acceptably. The two curves (S21 and S11) are interdependent; therefore, it was not always possible to achieve a good correlation between simulations and measurements keeping the known physical entities real (substrate thickness, dielectric permittivity, track width).

Figure 6A:
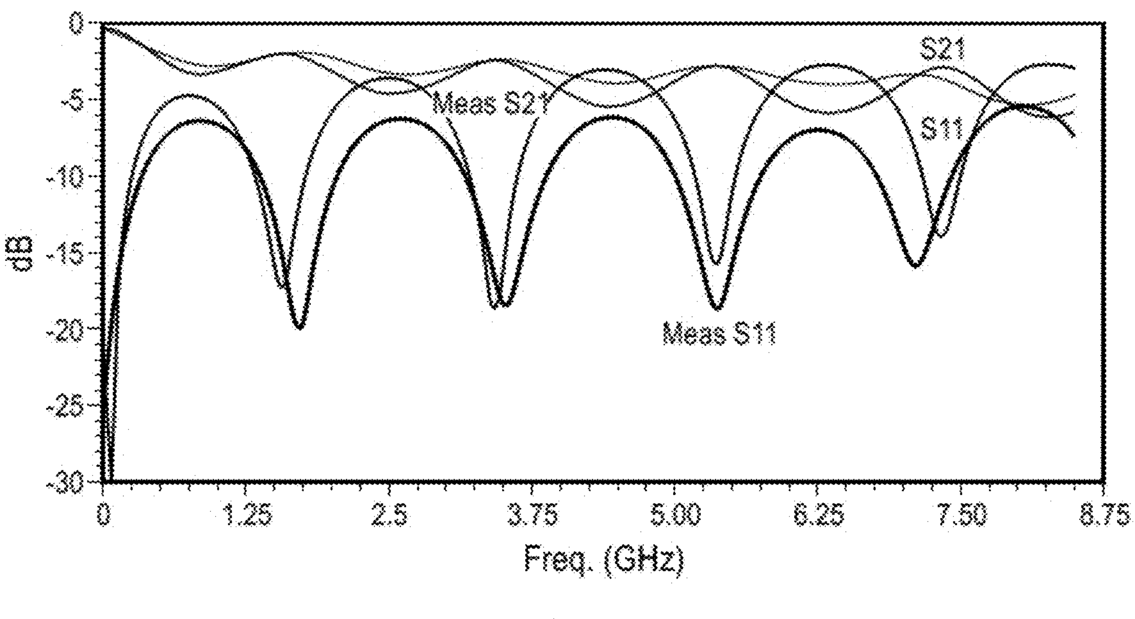
FIG. 6A illustrates simulated and measured S21 and S11 parameters for a copper antenna and FIG. 6B illustrates the parameters for the antenna with a SEL.
Figure 6B:
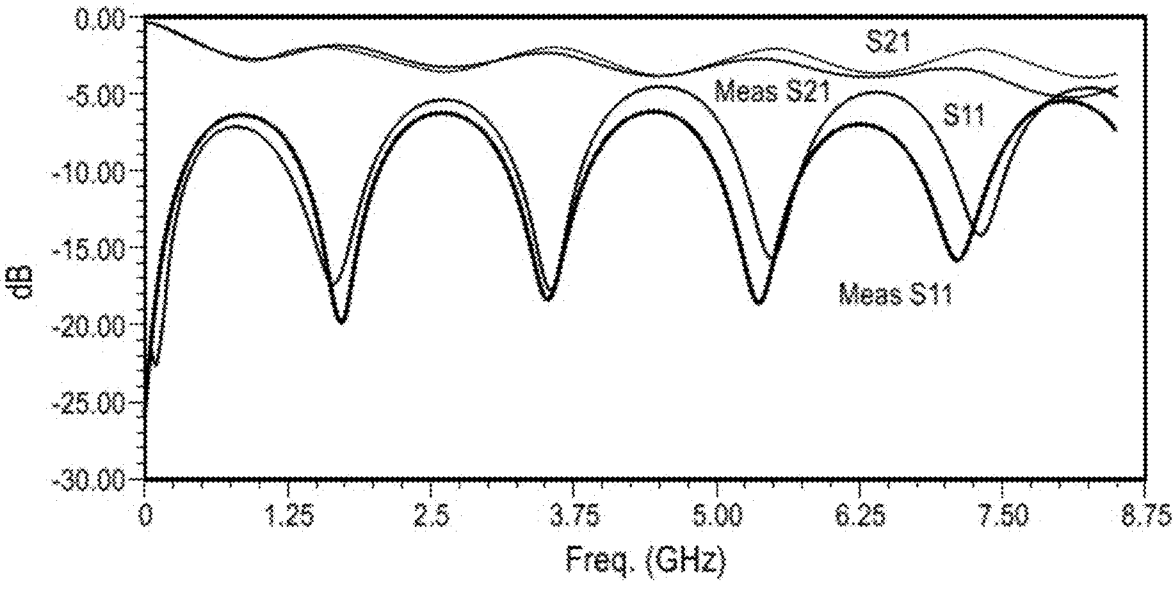
Figure 7A:
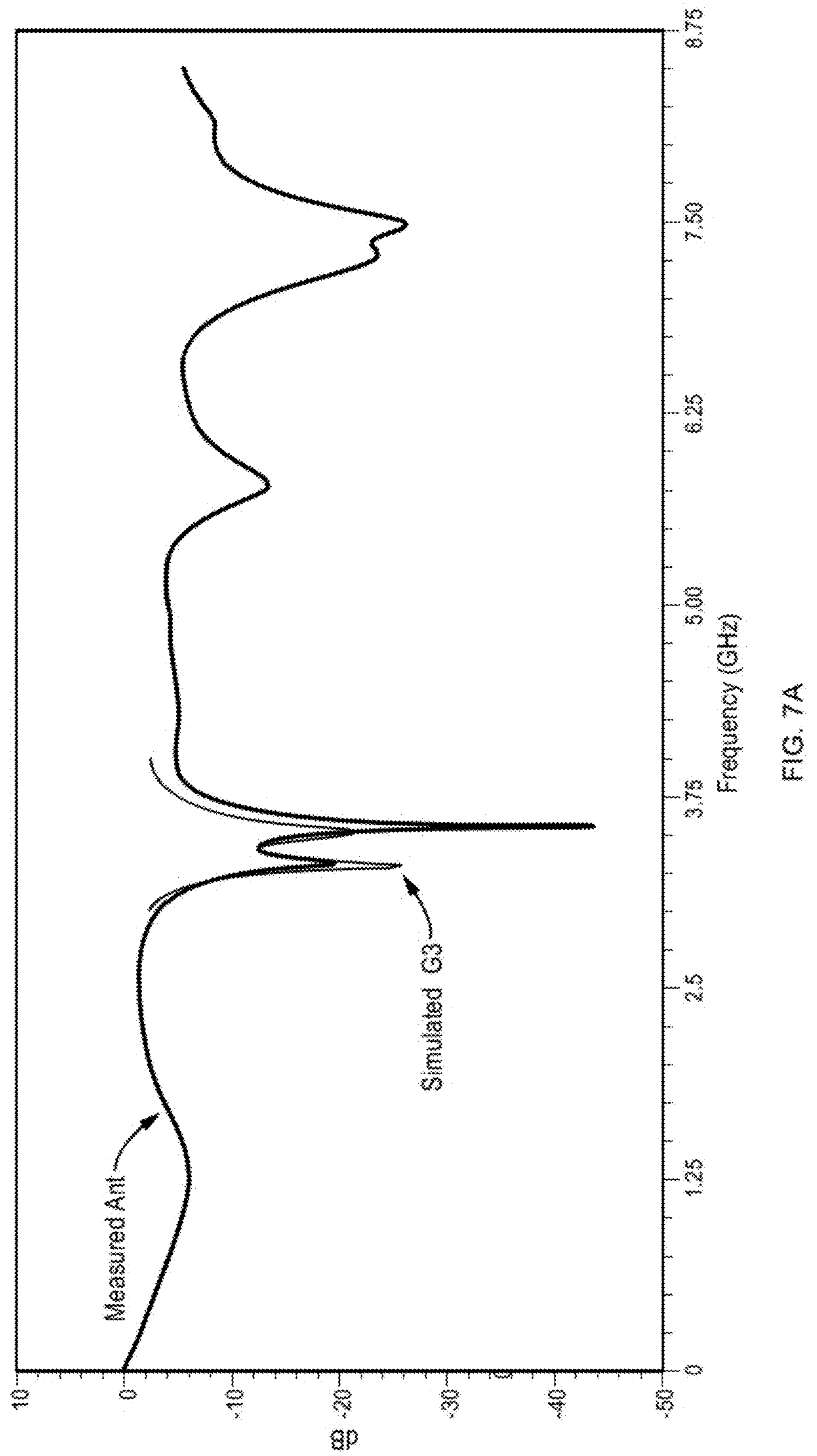
FIG. 7A illustrates return loss results for a patch antenna simulation and measured values.
Figure 7B:
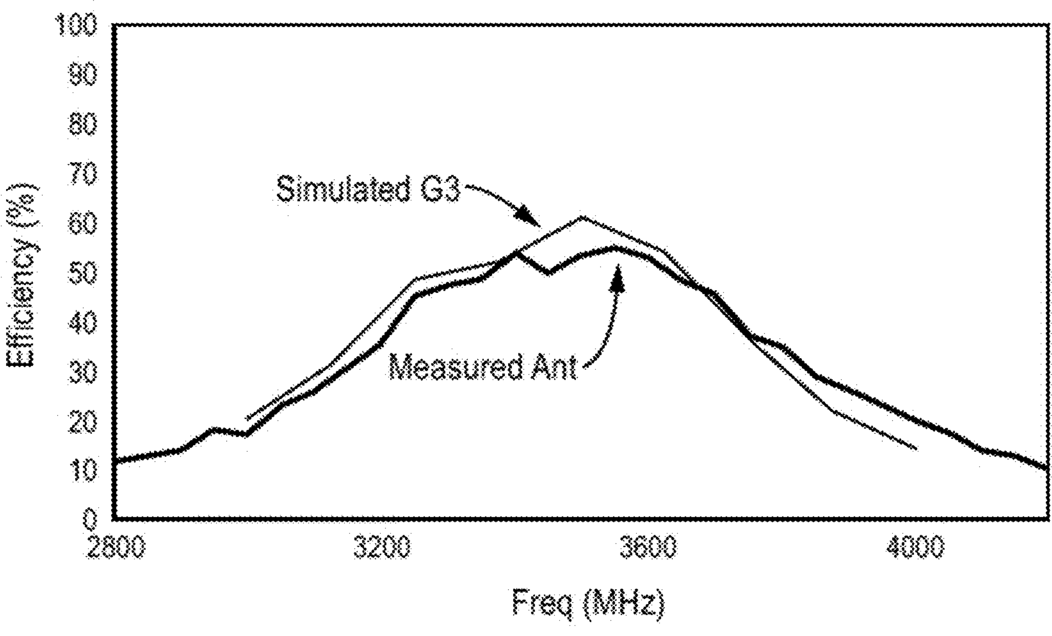
FIG. 7B illustrates the efficiency.
Figure 7C:
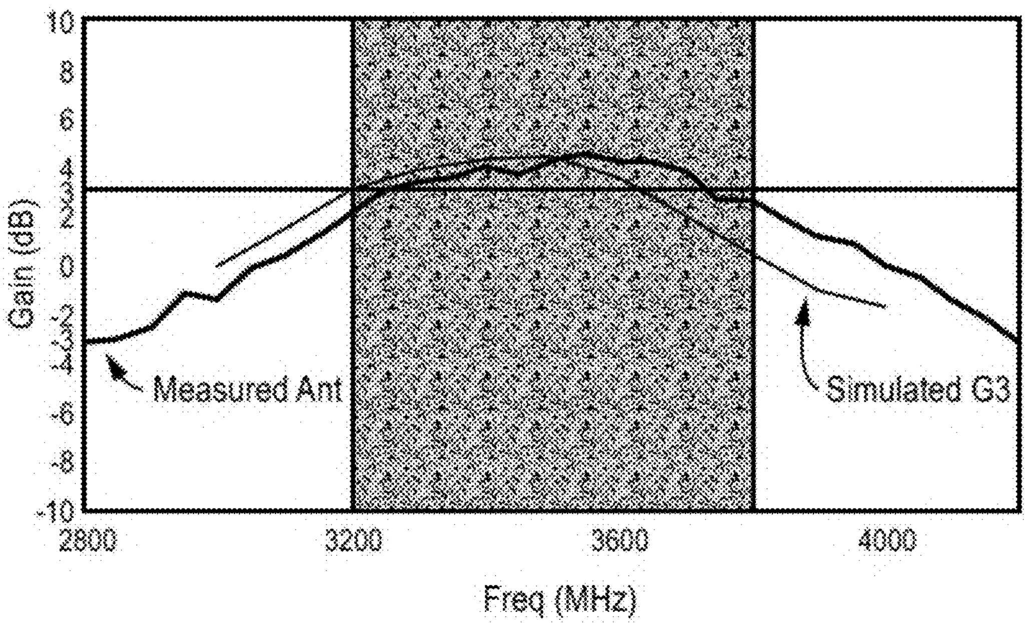
FIG. 7C illustrates the gain.

MM-G3 Microstrip Simulation Results:

For the MM-G3 geometry (100 um line pitch), simulation of the antenna did result in solution closure for the calculations, which is shown in FIGS. 6A and 6B. Sheet resistance and reactance were defined as a frequency dependent function (bulk metal does not require this), with very good correlation of the simulated and measured S parameters.

Antenna Simulation & Measurement Results:

Evaluation was carried out using a patch antenna design similar to that of FIG. 2A. The evaluation was done with the pitch of the metal mesh lines (i.e., spacing) as a variable, which showed the impact on the geometry on measured antenna performance (return loss (reflectance), gain, efficiency, radiation pattern).

Figures 8A, 8B, 8C:
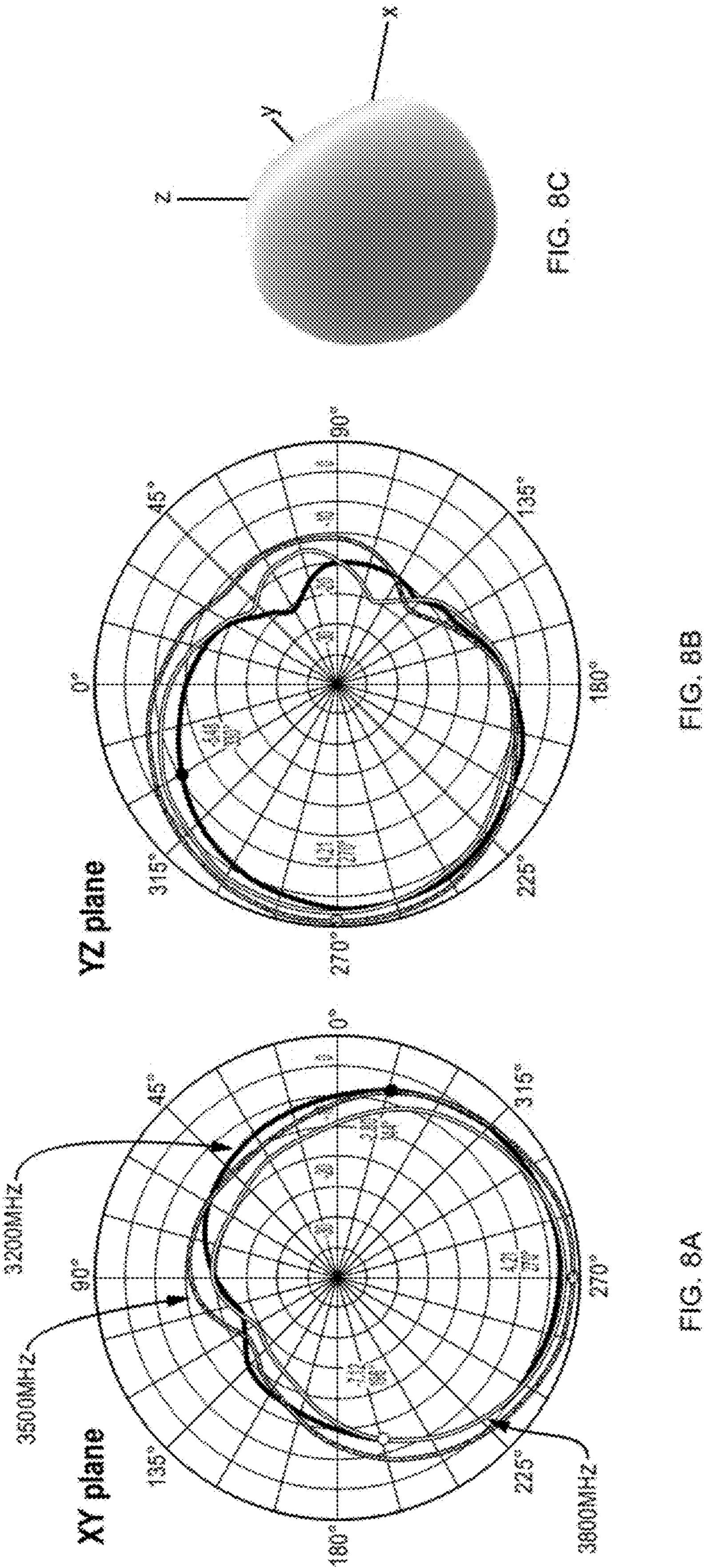
FIGS. 8A-8C illustrate the radiation pattern for the antenna illustrated in FIGS. 7A-7C.
Figure 9A:
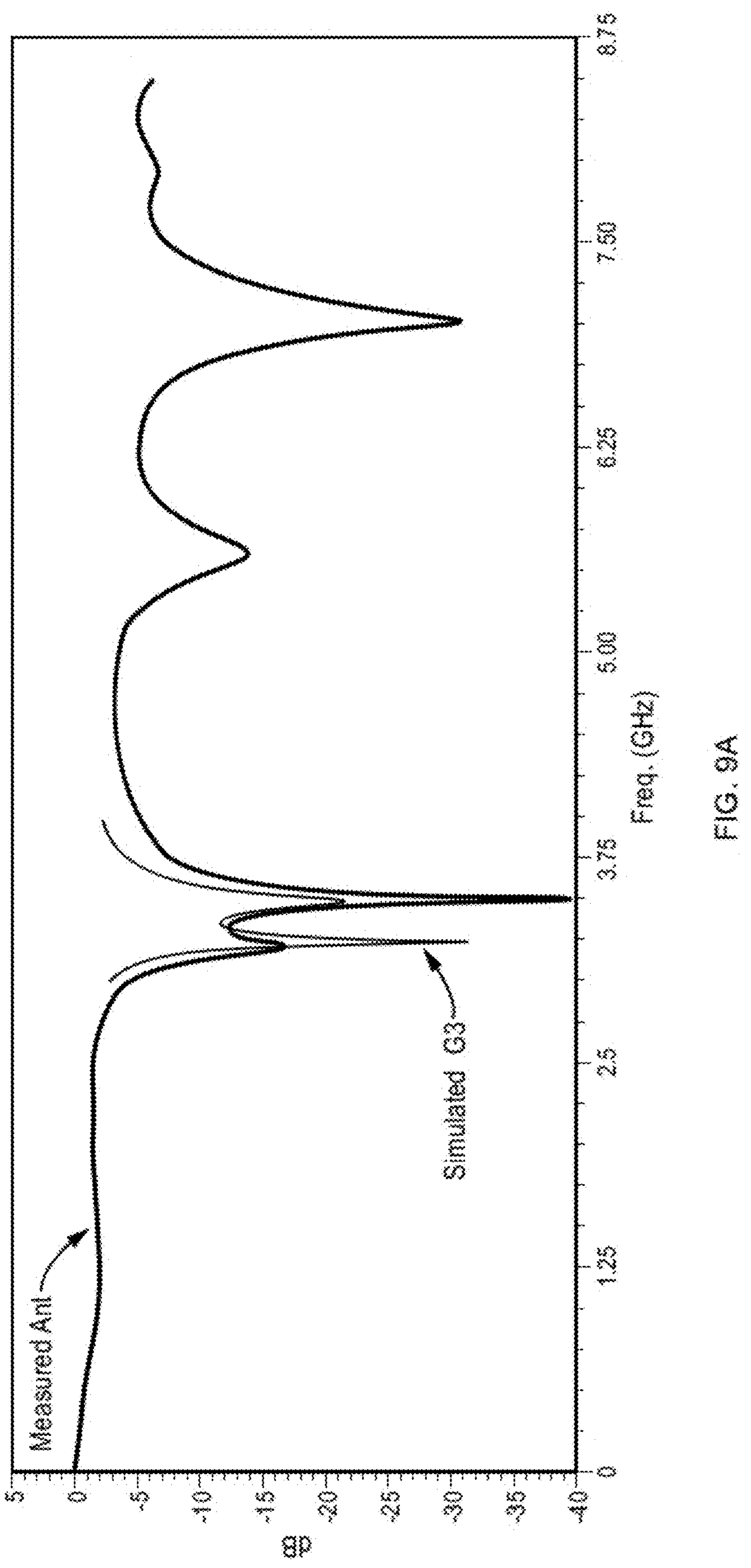
FIG. 9A illustrates return loss results for a patch antenna simulation and measured values.
Figures 9B, 9C:
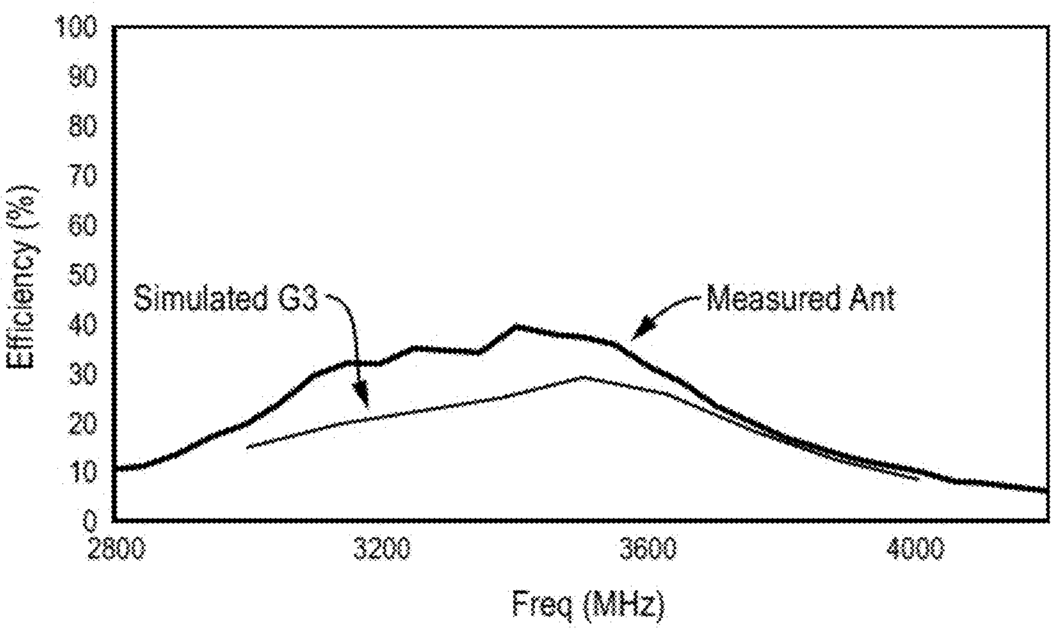
FIG. 9B illustrates the efficiency.
FIG. 9C illustrates the gain.
Figures 10A, 10B, 10C:
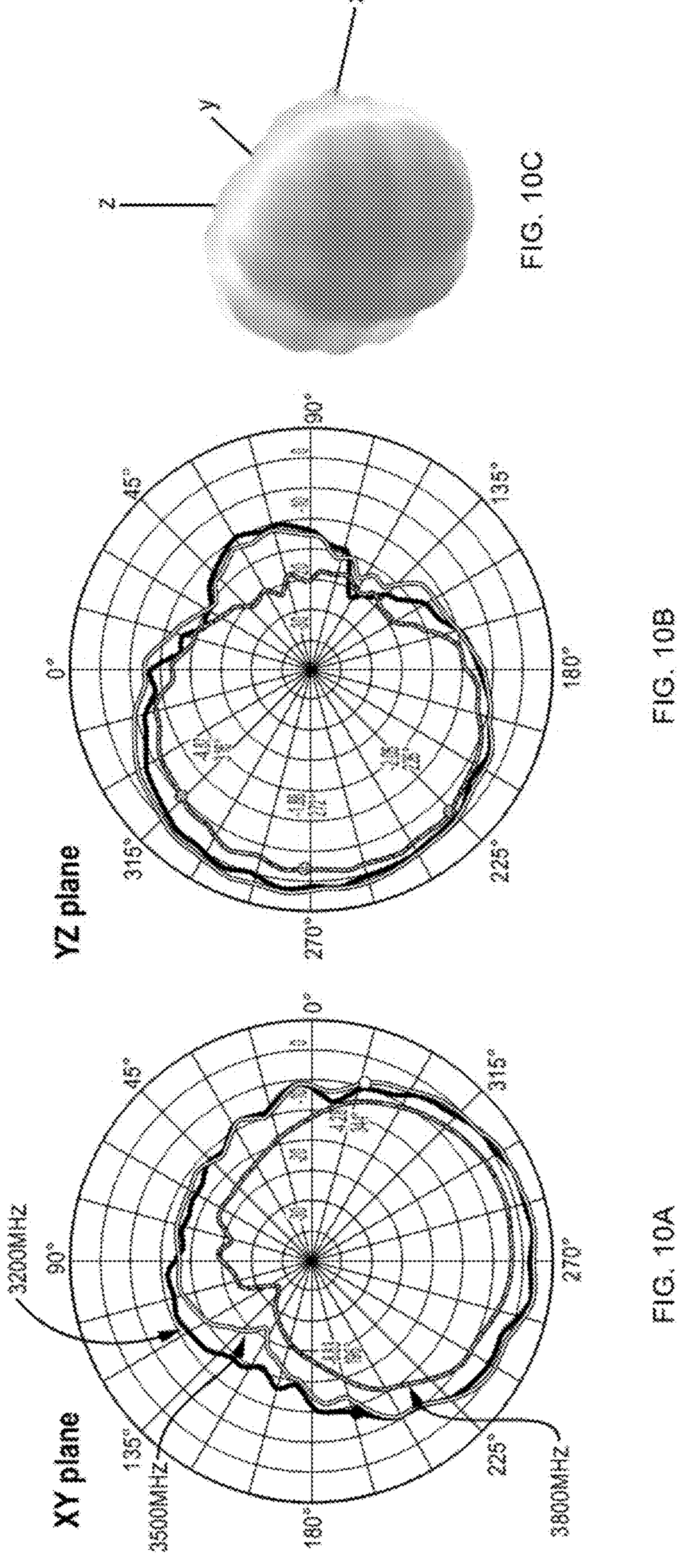
FIGS. 10A-10C illustrate the radiation pattern for the antenna illustrated in FIGS. 9A-9C.

G3 Patch Antenna Prototype Tests:

FIGS. 7A-7C and 8A-8C display the return loss results for the patch antenna simulation and measured values, the antenna efficiency, and the antenna gain, and the radiation pattern. For a "MM-G3" design (which had a 100 micron line pitch in a square pattern), FIGS. 8A-8C illustrate very good correlation between S11 measured and simulated. The manufactured antenna showed a slightly broader bandwidth than was simulated.

G3 Efficiency and Peak Gain Comparison

Efficiency (FIG. 7B) and peak gain (FIG. 7C) confirm the larger bandwidth without compromising on absolute efficiency values across the bandwidth. The desired peak gain falls slightly below the threshold only at the lower edge of the band (<3220 MHz).

G2 Patch Antenna Prototype Tests:

FIGS. 9A-9C and 10A-10C display the return loss results for the patch antenna simulation and measured values, the antenna efficiency and gain, and the radiation pattern for a "MM-G2" design which had a 300 micron line pitch in a square pattern.

G2 Patch Antenna Prototype Tests—Return Loss Comparison

There is a lower correlation between S11 measured and simulated (vs. G3). The manufactured antenna showed a much broader bandwidth than simulated (ca 50%). See FIG. 9A.

G2 Efficiency and Peak Gain Comparison

Efficiency (FIG. 9B) and peak gain (FIG. 9C) confirm the larger bandwidth without compromising on absolute efficiency values across the bandwidth. Measured efficiency was also higher than predicted. The G2 material (due to higher resistivity) was not expected to meet the desired minimum peak gain across the whole band. However, because of the higher efficiency, peak gain was higher than simulated. Both the return loss results and the efficiency impact are related to the design of the microstrip testing. Conductor lines of the microstrips were primarily smaller than design rules used herein (any feature must be at least 10× of the MM pitch as a physical dimension). The patch antenna met this design rule, and therefore performed well, vs. prediction.

G2 Radiation Patterns

Uniformity of the field is lower compared to results obtained with G3 material. See FIGS. 10A, 10B, and 10C.

Noteworthy is the larger line spacing (300 micron pitch) performance is reasonable but is not as good as the smaller line spacing (100 micron pitch).

The significant difference between the microstrip results for G2 and the patch antenna results is that the microstrip did not incorporate the specific design rule learning that the feature size of a MM conductor must be at least 10× the pitch of the MM. For example, for the G2 mesh pattern, conductor lines should have a width of at least 3 mm. For example, for the G1 mesh pattern, conductor lines should have a width of at least 1 mm.

Figure 11:
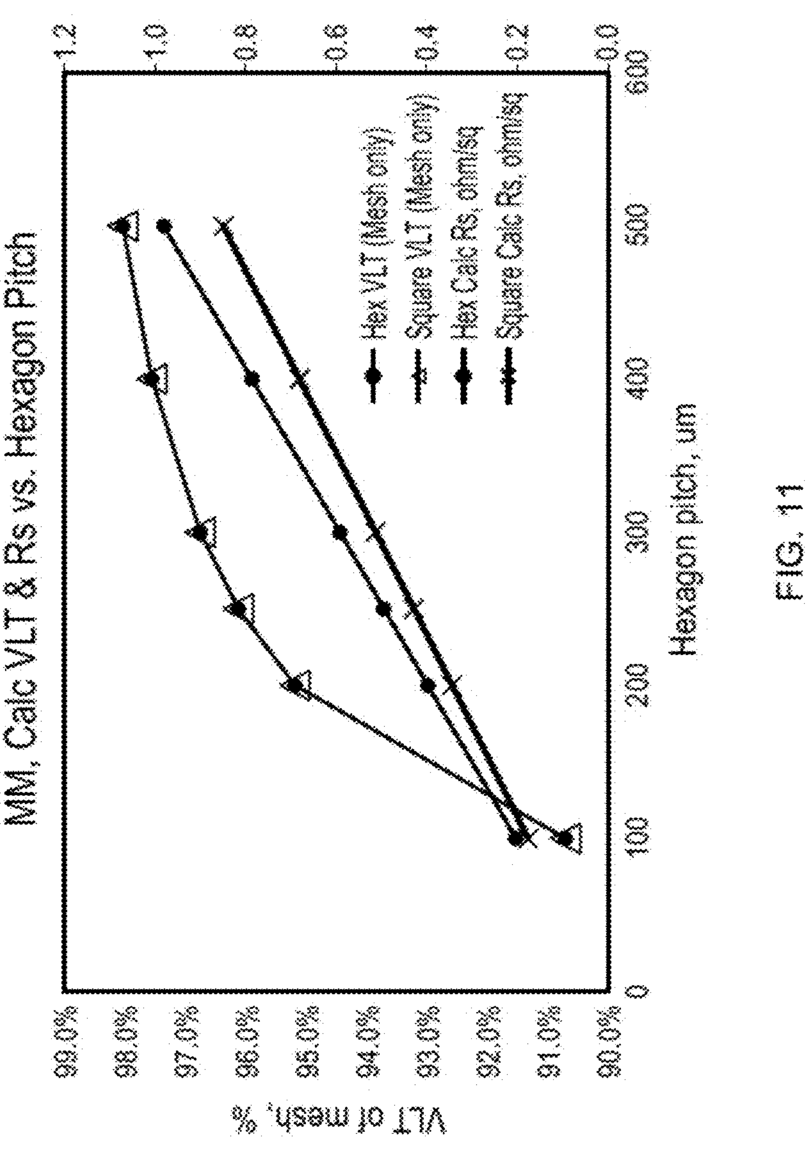
FIG. 11 illustrates the VLT and sheet resistance of two SEL antenna simulations.

Impact of Metal Mesh Geometry On VLT and Sheet Resistance:

The width of the metal mesh lines impacts visibility (VLT) of the antenna and therefore the definition of a "transparent antenna". See FIG. 11.

Further Material Observations:

Width of the metal mesh lines impacts sheet resistance of the electrical conductor.

Pitch of the metal mesh lines impacts sheet resistance (electrical properties of the conductor).

Metal mesh can be used as the conductor, the ground plane, and the tuning layer for an antenna.

Figure 12B:
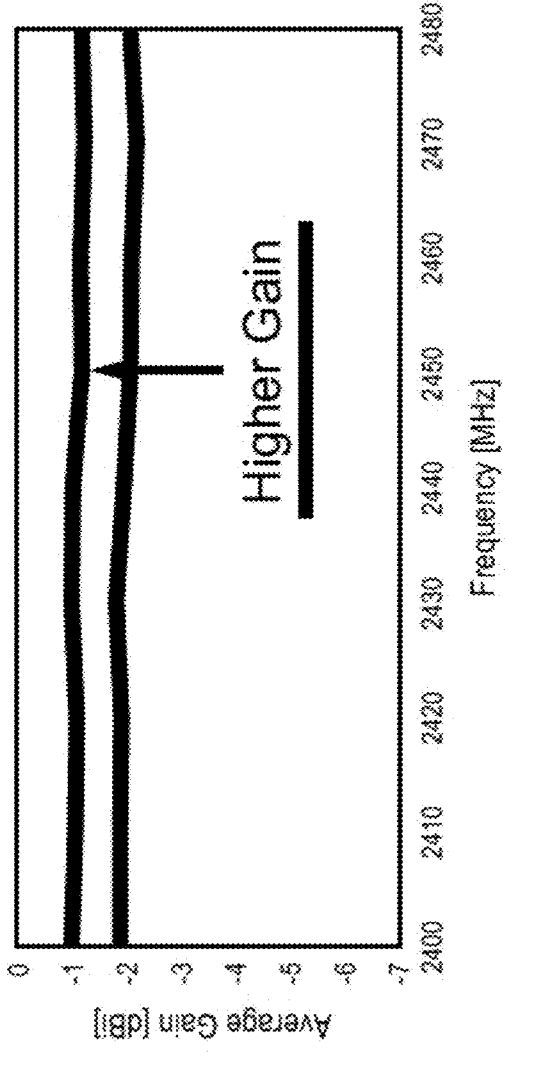
FIG. 12A is a polar plot for a copper antenna and a SEL antenna and FIG. 12B illustrates the gain of both antennas.
Figure 12A:
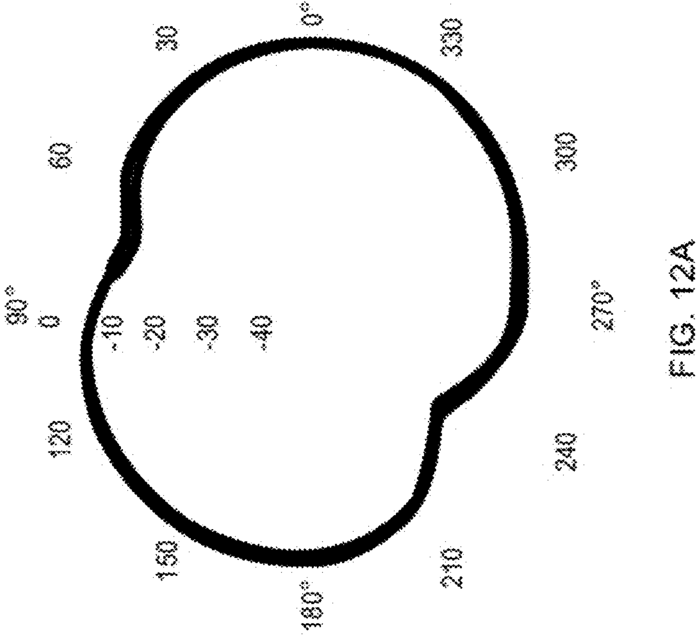

The use of the metal mesh results in performance equivalent to bulk metal antenna designs. See FIGS. 12A and 12B that illustrate a monopole transparent Bluetooth antenna made with copper and with the CNT SEL layer. The radiation patters of the two are essentially identical (FIG. 12A). The top gain curve (higher gain) is for the SEL antenna.

Multiband Antenna Design:

Inclusion of capacitors in the circuit can be used to tune the metal mesh antenna to specific frequencies or for multiband response. This process demonstrated that adjustment allows tuning of the SEL antenna to specific frequencies over a broad range.

Figure 13A:
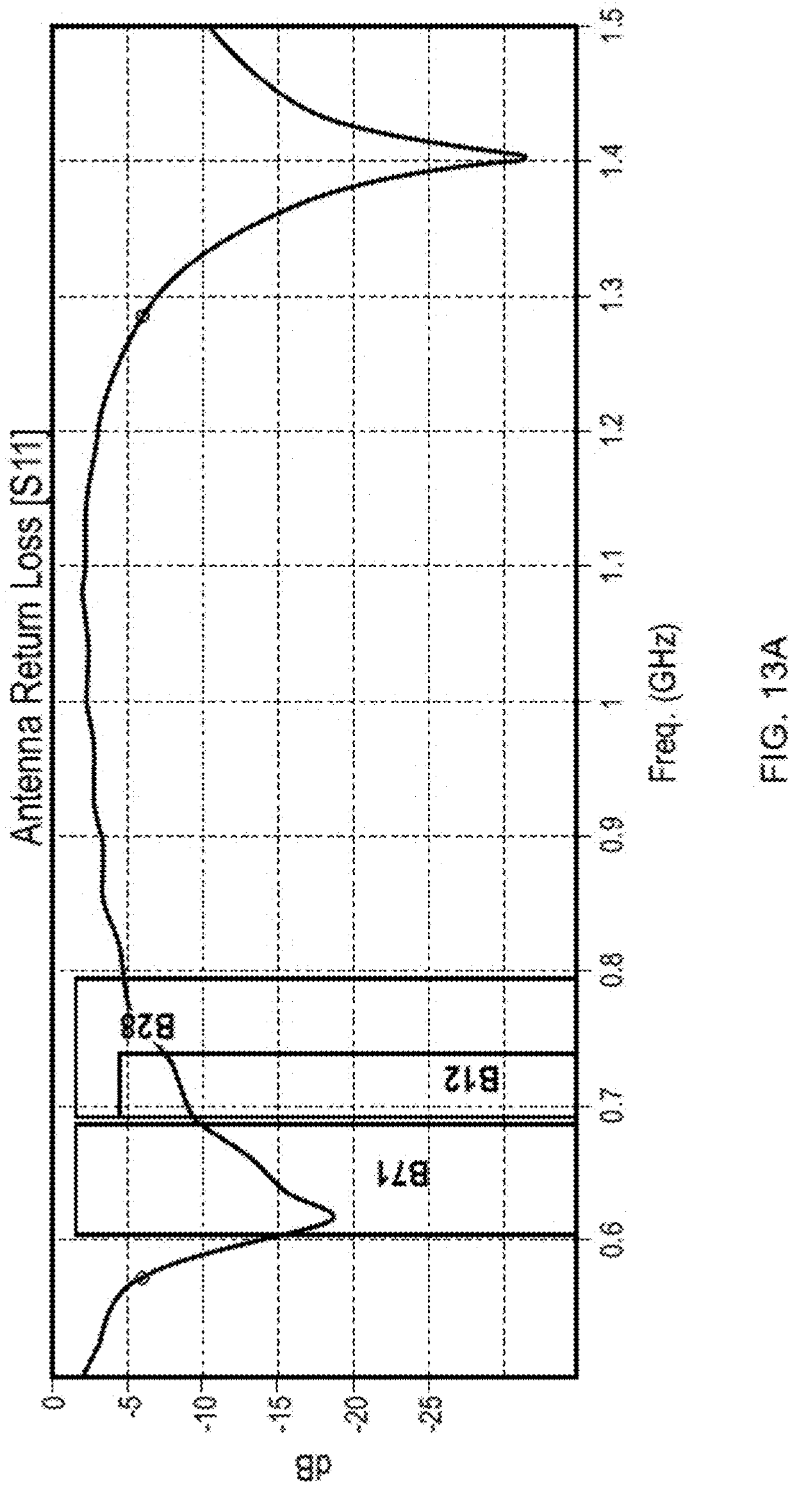
FIG. 13A illustrates return loss for a low-frequency tuned SEL antenna and FIG. 13B illustrates return loss for a high-frequency tuned SEL antenna.
Figure 13B:
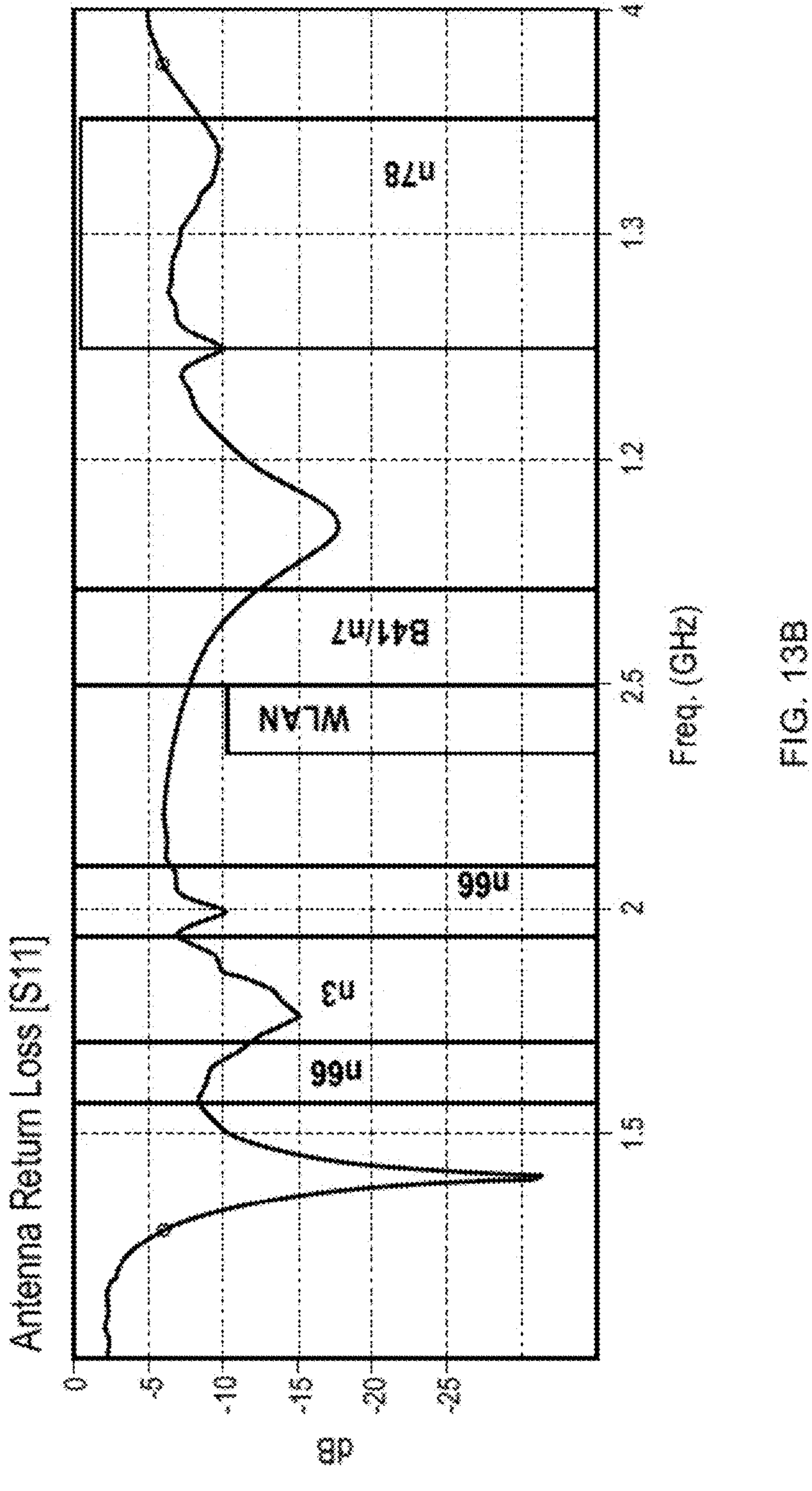

For example, FIG. 13A illustrates tuning at low frequency bands group A [570-750 MHz]. FIG. 13B illustrates tuning at high frequency bands group B [1300-3800 MHz].

Antenna Fabrication Examples

1 Ohm/Square MM Version:

1. A TCF (transparent conductive film) was prepared using PET (100 um) as the substrate, which was supplied having a copper metal mesh (MM) deposited in a square pattern having a 300 micron pitch, 5 micron wide lines with a height of 2 microns. This MM structure was identified as MM-G2. The copper MM film was screen-printed with a carbon nanotube ink (VC201 single wall CNT ink from Chasm Advanced Materials Inc.) using a 305 polyester mesh screen (~30 um wet-film thickness) having a 2.5 inch block pattern. The ink was formulated to a CNT concentration of 0.1 g/L and included the binder (polymer binder; a modified methacrylic copolymer) at a binder: CNT ratio of 240:1. The printed CNT layer was dried using a tunnel dryer @ 100 C, for a 3-4 minute dwell time. The sample was allowed to cool to ambient temperature (25° C.).

Films were processed through an auto-etcher, containing 10% FeNO3 solution, followed by D.I. water rinsing & drying.

After screen-printing the 240:1 binder: CNT ink and etching, the % VLT and Rs remained at 90.6% (subtracting the substrate) and <1/u respectively in the 2.5" CNT pattern area. In the exposed areas outside the 2.5" CNT pattern area, % VLT and Rs both increased to 99.6% (subtracting the base) and infinity respectively.

2. A TCF was prepared using PC (175 um) as the substrate, which was supplied having a silver nanowire coating uniformly applied to the substrate. The AgNW film was screen-printed with a carbon nanotube ink (VC200 single wall CNT/graphene ink from Chasm Advanced Materials Inc.) using a 305 polyester mesh screen (~30 um wet-film thickness) having a 2.5 inch block pattern. The ink was formulated to a CNT/graphene concentration of 0.05/.05 g/L respectively and included the binder (polymer binder; a modified methacrylic copolymer) at a binder: CNT ratio of 120:1. The printed CNT layer was dried using a tunnel dryer @ 100 C, for a 3-4 minute dwell time. The sample was allowed to cool to ambient temperature (25° C.).

Films were processed through the auto-etcher, containing 10% FeNO3 solution, followed by D.I. water rinsing & drying.

After screen-printing the 120:1 binder: CNT ink and etching, the % VLT and Rs remained at ~92% (subtracting the substrate) and 10/□ respectively in the pattern area. In the exposed areas outside the CNT pattern area, all excess AgNW was etched away.

The polymer binder plays a role in enhancing environmental stability and adhesion of the printed CNT hybrid circuit. It also plays a role in protecting the MM from being chemically etched (i.e., it is a component for providing the etch mask functionality). The binder should have good environmental stability and adhesion properties, and should be highly transparent with low haze.

It is reasonable to expect that many different binders could be used. Selection criteria for suitable polymer binder candidates include:

Good optical properties (high transparency, low haze, low color, refractive index similar to PET)

Good adhesion to commonly used plastic film substrates (PET, PC, Acrylic, etc.)

Temperature processing requirements compatible with the plastic film substrates (<120 C)

Solubility compatible with the ink formulations (e.g., good solubility in alcohol and/or amine components).

Chemical resistance to common etchants used for Cu.

The CNT type used in the examples was single-wall CNT. However, it is reasonable to expect that good results could also be achieved by substituting double-wall or few-wall or multi-wall CNT.

EMI Shielding Examples

Samples of AgeNT films were tested for EMI shielding effectiveness. The shielding effectiveness (SE) is typically defined as the ratio of the magnitude of the incident electric field, $E_i$, to the magnitude of the transmitted electric field, $E_t$:

$$SE = \left|\frac{\vec{E}_i}{\vec{E}_t}\right| SE\,(\text{dB}) = 20\,\log_{10}\left(\frac{E_i}{E_t}\right)$$

The higher the dB value the more the signal is going to be attenuated. The attenuation is frequency dependent, largely based on the openings of the shielding material. With transparent shielding there is a trade-off of attenuation versus Total Visible Light Transmission. Results of attenuation are shown in the examples below.

EMI Shielding Example #1

Both metal mesh and silver nanowire AgeNT structures were tested. Example #1 results were performed using a sample which had grounding contacts on 2 of the 4 sides of the samples. In spite of not being fully encased with grounding contacts, the SE was significant. A detailed description and results are noted below.

"Test 2.1.2" Test Method

The test was performed in the shielded enclosure manufactured by Sprague Shielding Corporation. Attenuation tests have demonstrated that the shielded enclosure meets the attenuation requirements of IEEE-STD-299.

The available AC power within the shielded enclosure is 110V AC, 220V AC, single and three phase, 60 cycle. The power line filters are rated for 100 dB of attenuation from 10 kHz to 10 GHz.

Support equipment, such as signal generators and computer system were located outside of the shielded enclosure.

The detection system was located inside the shielded enclosure. A matched transmit and receive antenna was placed on either side of a common wall where the material under test was mounted.

A 16 inch×16 inch adapter plate, with 6.25 inch×3.5 inch aperture in the center, was mounted to the chamber wall. Double row copper fingers were used along the perimeter of the adapter plate interface to the wall.

The transmit and receive antennas were each placed 0.75 meters from either side of the aperture. Open reference measurements were then taken through the aperture and recorded.

Figure 14A:
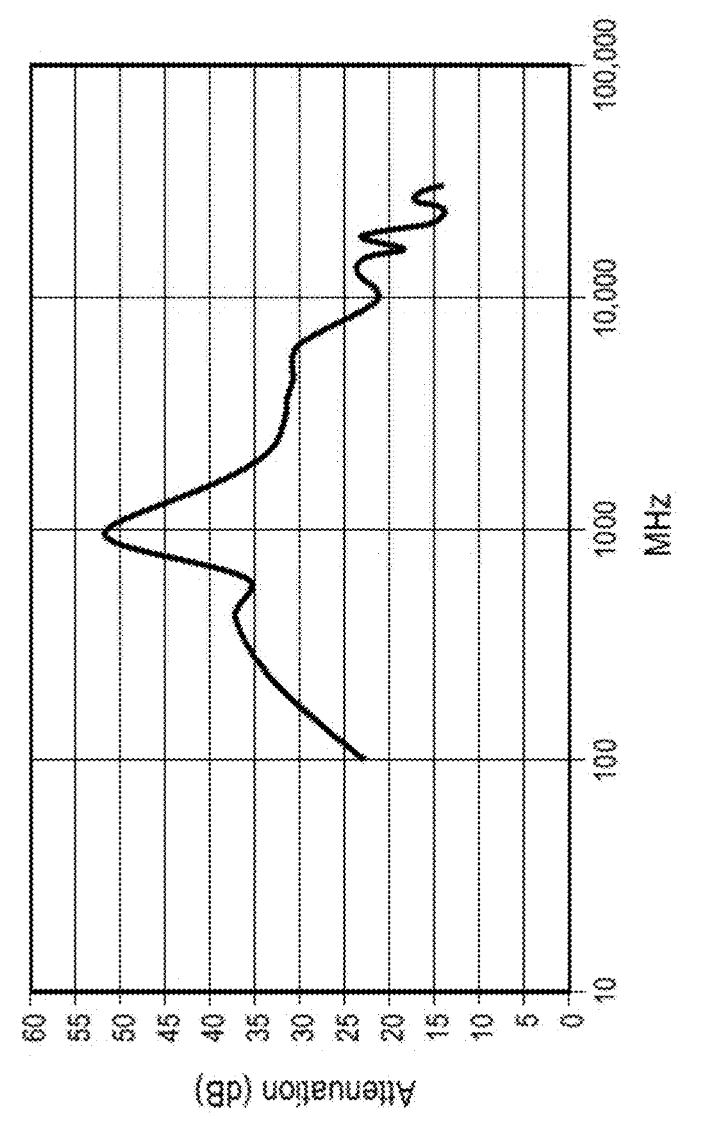
FIG. 14A illustrates shielding effectiveness for a SEL-based shield.
Figure 14B:
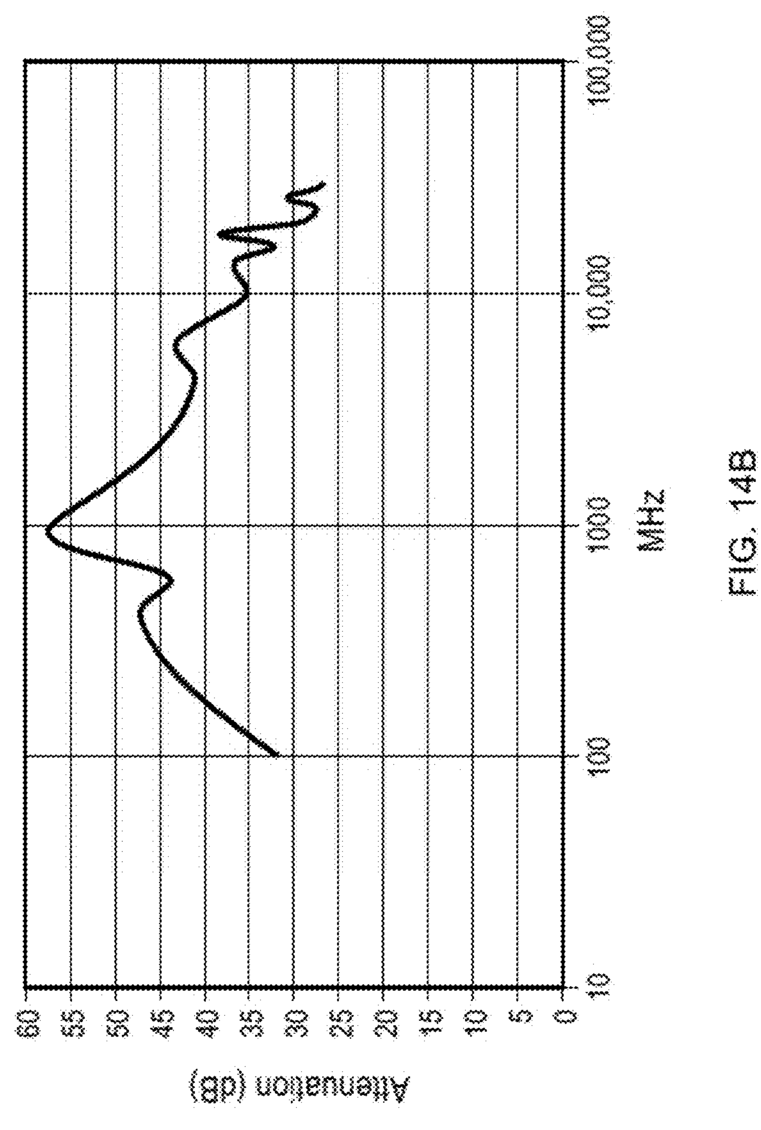
FIG. 14B illustrates shielding effectiveness for another SEL-based shield.
Figure 14C:
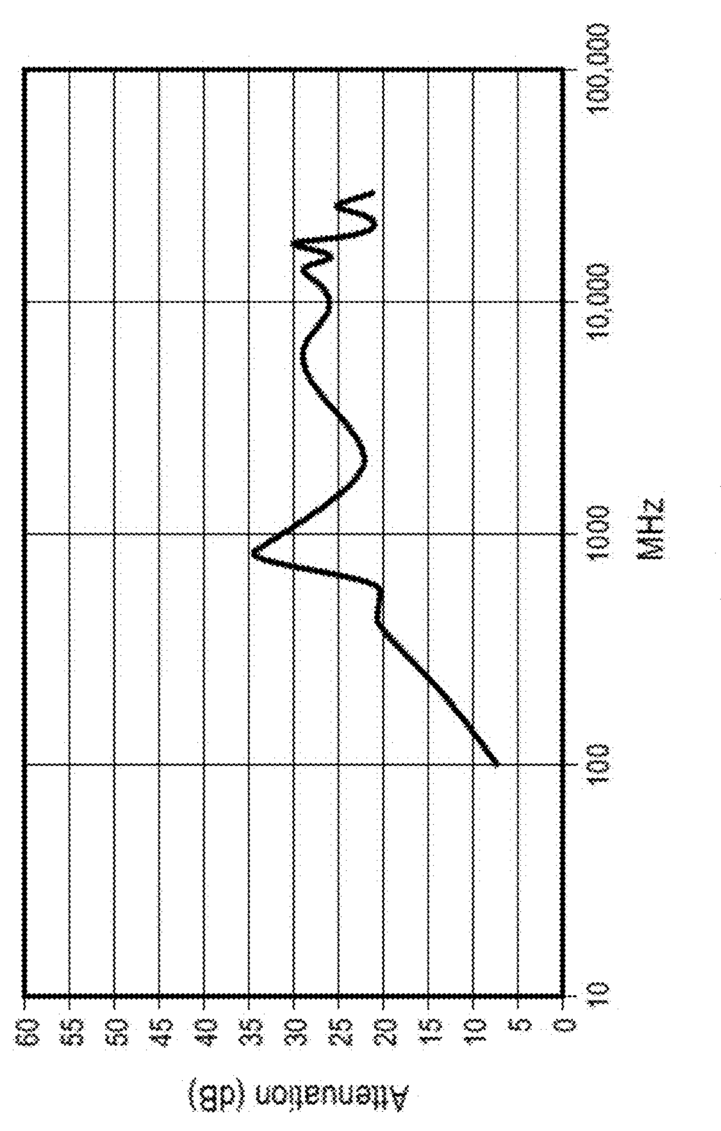
FIG. 14C illustrates shielding effectiveness for another SEL-based shield.

After the open reference measurements were complete, the protective backing on the AgeNT G2-1 sample was removed to expose the coated side. This side was placed over the aperture and pressed in place by a metal frame with 6 screws. Measurements were taken again at the same frequencies and signal generator levels as with the open references and recorded on the data sheet. SE=Oper. Reference Level (dB)—level (dB) with Sample Installed. This process was repeated for the remaining 2 samples. See FIGS. 14A and 14B (MM, 1 ohm/sq) and FIG. 14C (AgNW, 10 ohm/sq).

The E-field test was performed at the frequencies of 100 MHZ, 200 MHZ, 400 MHZ, 600 MHz, 800 MHZ, 1 GHZ, 2 GHZ, 6 GHZ, 8 GHZ, 10 GHz, 12 GHz, 14 GHz, 16 GHz, 18 GHz, 20 GHz, 22 GHz, 24 GHz, 26 GHZ, 28 GHz, and 30 GHz.

EMI Shielding Example #2

Figure 15:
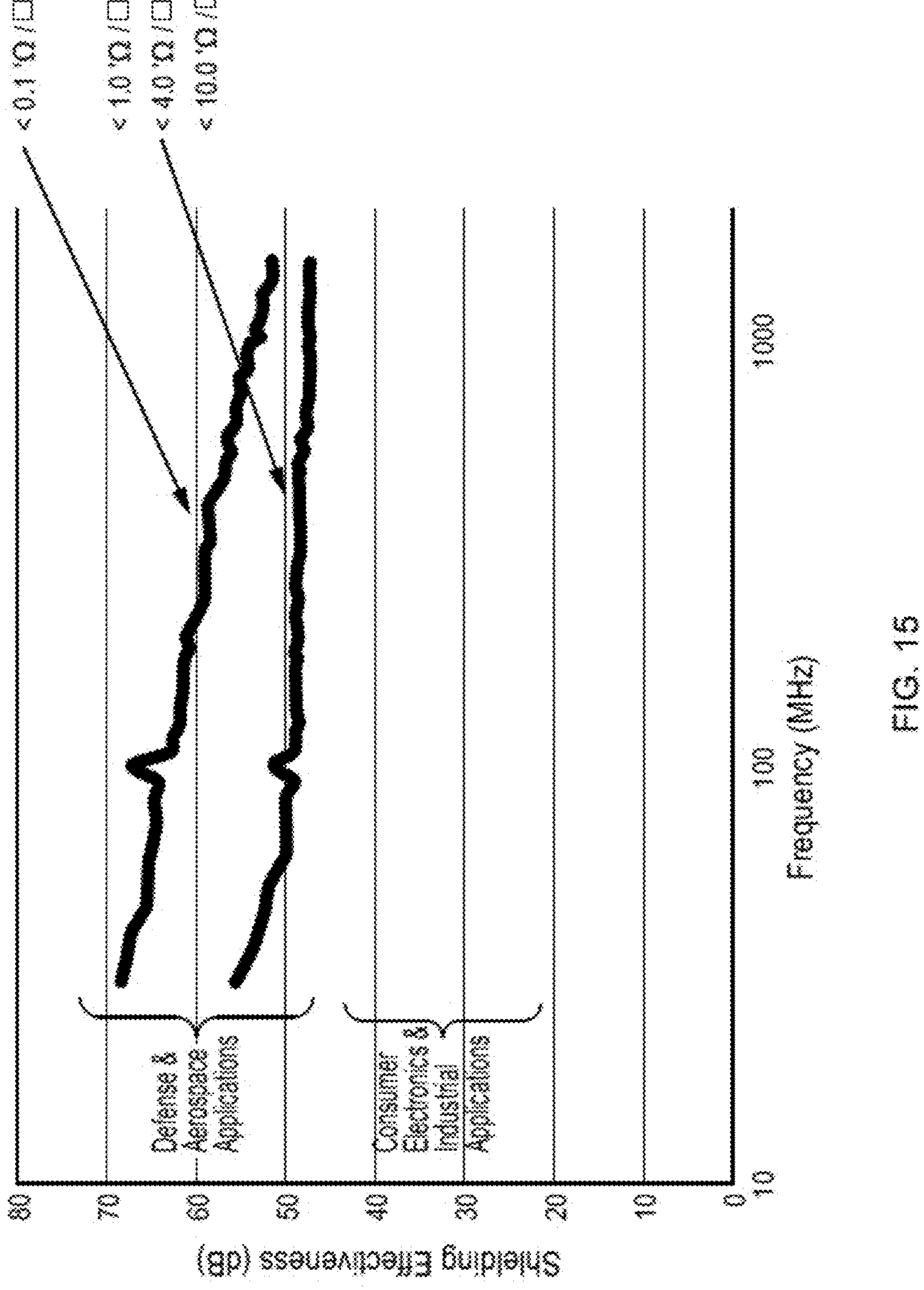
FIG. 15 illustrates the EMI shielding effectiveness of SEL-based shields having different sheet resistance levels.

There is a need for transparent EMI shielding films that are capable of providing high EMI shielding effectiveness across a wide range of frequencies (1 MHz to 40 GHz). This is especially important for defense and avionics applications, as well as security glass applications. Exemplary performance requirements are shown in FIG. 15, which illustrates that shielding is better with lower sheet resistances. Testing was conducted to compare a current product with AgeNT.

Figure 16:
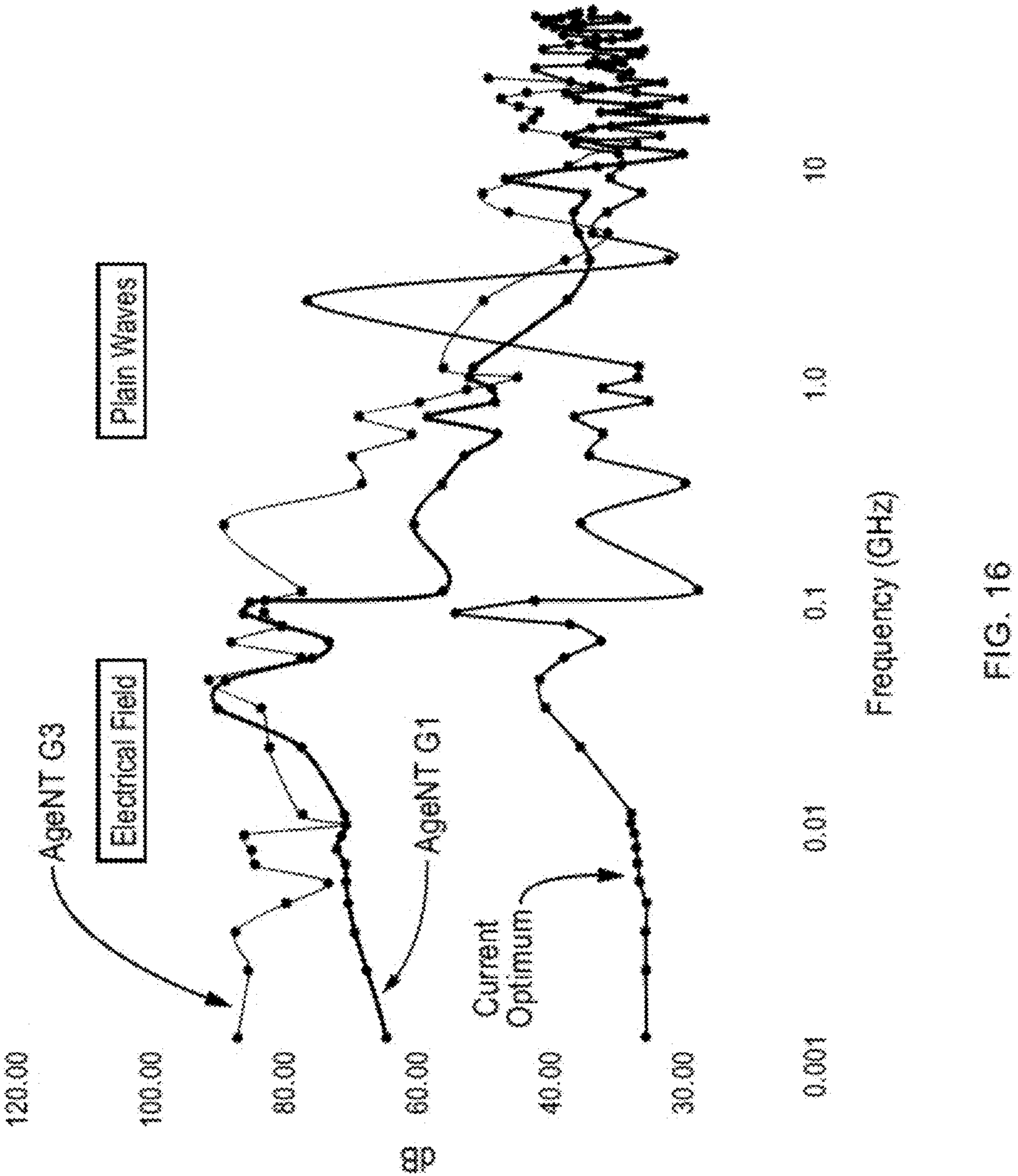
FIG. 16 compares the shielding effectiveness of two SEL-based shields to a state-of-the-art shield.

AgeNT EMI Shielding Films provide this high Shielding performance while preserving high transparency. FIG. 16 presents data that shows AgeNT-1-G3 and AgeNT-G1 meet the demanding spec of 40 dB Attenuation (the horizontal dashed line), which means that more 99.99% of the power is attenuated, with total visible light transmission being >76% (including the s-Glass).

Results comparing the current optimum product with AgeNT-G1 and AgeNT-G3 are shown in FIG. 16 and display superior or at least comparable SE across a wide frequency range of up to about 10 GHz, and above.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An EMI shield, comprising:

a substrate;

a conductive layer on a surface of the substrate and comprising either a metal mesh (MM) layer that comprises a metallic grid composed of ultranarrow interconnected spaced linear metal structures or a nanowire layer that comprises nanowires randomly distributed on the surface and with diameters that are less than their lengths; and a signal enhancement layer directly on top of the conductive layer and that comprises conductive nanoparticles that comprise one or both of carbon nanotubes (CNTs) and graphene, wherein the areal coverage of the conductive nanoparticles in the signal enhancement layer is from 0.75 mg/m2 to 5 mg/m2.

2. The EMI shield of claim 1 wherein the conductive layer and the signal enhancement layer together have a visible light transmission (VLT) of at least 90%.

3. The EMI shield of claim 1 wherein the substrate comprises one of polyethylene terephthalate (PET), cycloolefin (COP), clear polyimide (CPI), and polycarbonate (PC).

4. The EMI shield of claim 1 wherein the metal mesh linear metal structures are made from at least one of copper, silver, aluminum and tin.

5. The EMI shield of claim 1 wherein the metal mesh linear metal structures have a spacing of 50, 100, 200, 250, 300, 400, or 500 microns, have a line width of 3, 5, 7, 10, 15, or 20 microns, have a line height of 0.25, 0.5, 0.75, 1, 2, or 3 microns, and are in a square, hexagonal, random or fractal pattern.

6. The EMI shield of claim 1 wherein the nanowires comprise silver and have diameters between 15 nm and 35 nm, lengths between 20 microns and 50 microns, and an areal coverage of from 15 mg/m2 to 150 mg/m2.

7. The EMI shield of claim 1 wherein the signal enhancement layer is made from an ink that comprises between 0.05 grams and 0.5 grams of the conductive nanoparticles per liter of ink.

8. The EMI shield of claim 1 wherein the signal enhancement layer further comprises a binder.

9. The EMI shield of claim 8 wherein the ratio of binder to conductive nanoparticles is 1:1, 20:1, 100:1, 200:1, 240:1, 300:1 or 400:1.

10. The EMI shield of claim 8 wherein the ratio of binder to conductive nanoparticles is from 1:1 to 400:1.

11. The EMI shield of claim 1 wherein the metal mesh linear metal structures have a spacing of 500 microns in a hexagonal pattern, a line width of 30 microns, and a line height of 0.5-1.5 microns.

12. The EMI shield of claim 1 wherein the metal mesh linear metal structures have a spacing of 300 microns in a square pattern, a line width of 5 microns, and a line height of 2 microns.

13. The EMI shield of claim 1 wherein the metal mesh linear metal structures have a spacing of 100 microns in a square pattern, a line width of 5 microns, and a line height of 2 microns.

14. An EMI shield, comprising:

a substrate;

a conductive layer on a surface of the substrate and comprising either a metal mesh (MM) layer that comprises a metallic grid composed of ultranarrow interconnected spaced linear metal structures or a nanowire layer that comprises nanowires randomly distributed on the surface and with diameters that are less than their lengths; and a signal enhancement layer directly on top of the conductive layer and that comprises conductive nanoparticles that comprise one or both of carbon nanotubes (CNTs) and graphene, wherein the signal enhancement layer is made from an ink that comprises between 0.05 grams and 0.5 grams of the conductive nanoparticles per liter of ink.

* * * * *